US012684731B2

(12) United States Patent

Rathinasamy et al.

(10) Patent No.: US 12,684,731 B2

(45) Date of Patent: Jul. 14, 2026

(54) IMMERSION COOLING CABLE TRACING SYSTEM

(71) Applicant: Dell Products L.P., Round Rock, TX (US)

(72) Inventors: Shree Rathinasamy, Georgetown, TX (US); Victor Teeter, Round Rock, TX (US); Padmanabhan Narayanan, Chennai (IN); Parminder Singh Sethi, Ludhiana (IN)

(73) Assignee: Dell Products L.P., Round Rock, TX (US)

( * ) Notice: Subject to any disclaimer, the term of this patent is extended or adjusted under 35 U.S.C. 154(b) by 277 days.

(21) Appl. No.: 18/656,160

(22) Filed: May 6, 2024

(65) Prior Publication Data

US 2025/0344344 A1 Nov. 6, 2025

(51) Int. Cl.
*H05K 7/20* (2006.01)

(52) U.S. Cl.
CPC ..... *H05K 7/20272* (2013.01); *H05K 7/20236* (2013.01)

(58) Field of Classification Search
CPC ......... H05K 7/1491–1492; H05K 7/20; H05K 7/203; H05K 7/208; H05K 7/20208; H05K 7/20209; H05K 7/20236; H05K 7/20239; H05K 7/20254; H05K 7/20263; H05K 7/20272; H05K 7/20281; H05K 7/20318; H05K 7/20327; H05K 7/20381; H05K 7/20718; H05K 7/20772; H05K 7/20781; H05K 7/20809; H05K 7/20836; H05K 5/00; H05K 5/067; G06F 1/20; G06F 1/206; H10W 76/47; G02B 6/4268
See application file for complete search history.

(56) References Cited

U.S. PATENT DOCUMENTS

| | | | | |
|---|---|---|---|---|
| 2019/0357378 A1* | 11/2019 | Kolar | ................. | H05K 7/20327 |
| 2022/0232734 A1* | 7/2022 | Ramakrishnan | ... | H05K 7/20327 |
| 2023/0059446 A1* | 2/2023 | Gao | ....................... | H05K 7/208 |
| 2023/0080447 A1* | 3/2023 | Shah | ................. | H05K 7/20836 |
| | | | | 361/679.53 |
| 2023/0084765 A1* | 3/2023 | Gao | ................... | H05K 7/20254 |
| | | | | 361/679.53 |
| 2024/0172393 A1* | 5/2024 | Ahuja | ................. | H05K 7/20772 |
| 2025/0098124 A1* | 3/2025 | Ma | ...................... | H05K 7/20781 |
| 2025/0107036 A1* | 3/2025 | Lee | ................... | H05K 7/20254 |

* cited by examiner

*Primary Examiner* — Amir A Jalali

(74) *Attorney, Agent, or Firm* — Joseph Mencher

(57) ABSTRACT

An immersion cooling cable tracing system includes a data cable having a first connector that is included on a first end of the data cable, and a second connector that is included on a second end of the data cable that is opposite the data cable from the first end. An air conduit is included on the data cable, extends along a length of the data cable, that includes an air inlet that is configured to receive an airflow, and an air outlet that is located adjacent to the second connector. The air outlet is configured to release the airflow received through the air conduit and via the air inlet into an immersion fluid when the second connector and the air outlet are immersed in the immersion fluid.

20 Claims, 23 Drawing Sheets

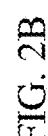
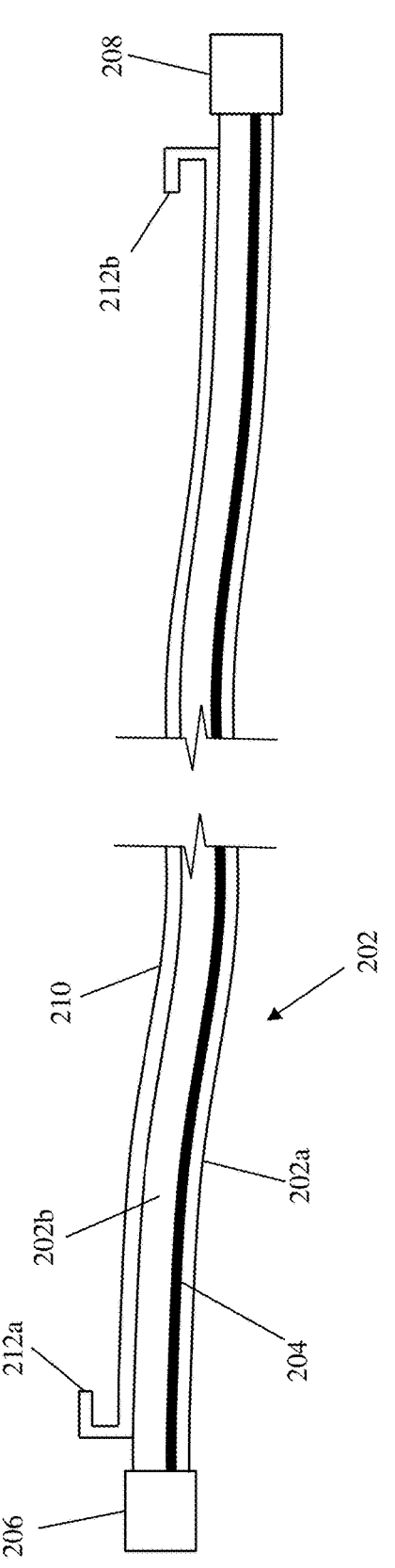
FIG. 2B

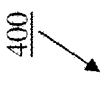
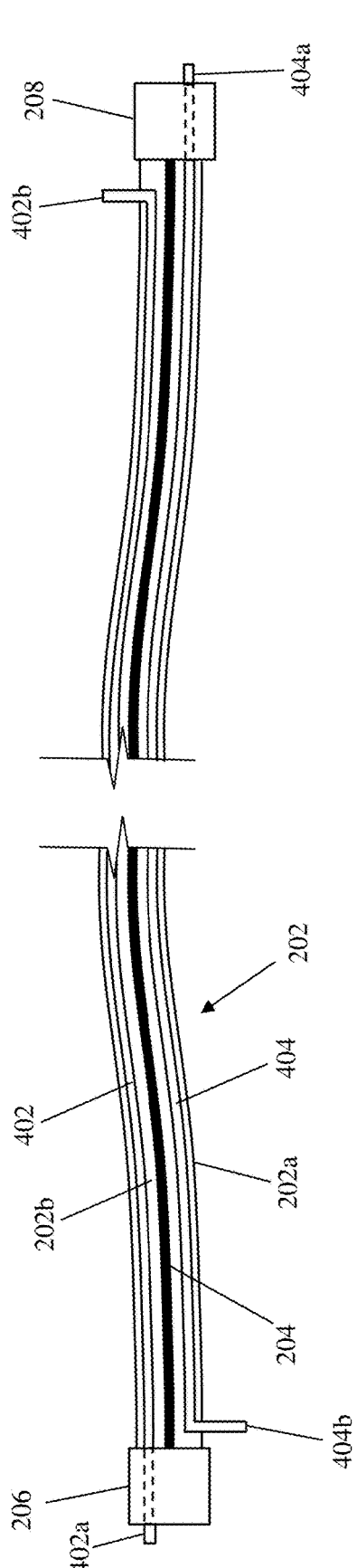
FIG. 4

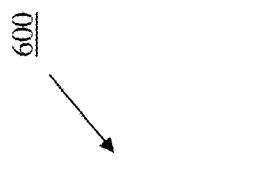

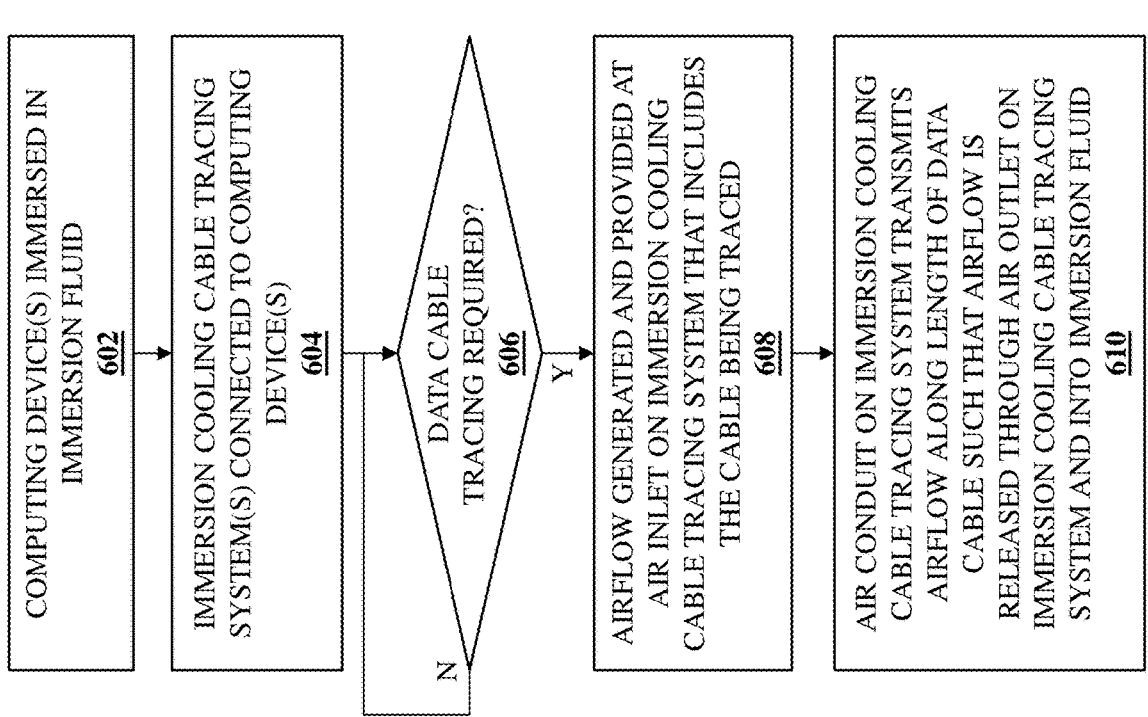

600

COMPUTING DEVICE(S) IMMERSED IN IMMERSION FLUID
602

IMMERSION COOLING CABLE TRACING SYSTEM(S) CONNECTED TO COMPUTING DEVICE(S)
604

DATA CABLE TRACING REQUIRED?
606

N

Y

AIRFLOW GENERATED AND PROVIDED AT AIR INLET ON IMMERSION COOLING CABLE TRACING SYSTEM THAT INCLUDES THE CABLE BEING TRACED
608

AIR CONDUIT ON IMMERSION COOLING CABLE TRACING SYSTEM TRANSMITS AIRFLOW ALONG LENGTH OF DATA CABLE SUCH THAT AIRFLOW IS RELEASED THROUGH AIR OUTLET ON IMMERSION COOLING CABLE TRACING SYSTEM AND INTO IMMERSION FLUID
610

FIG. 6

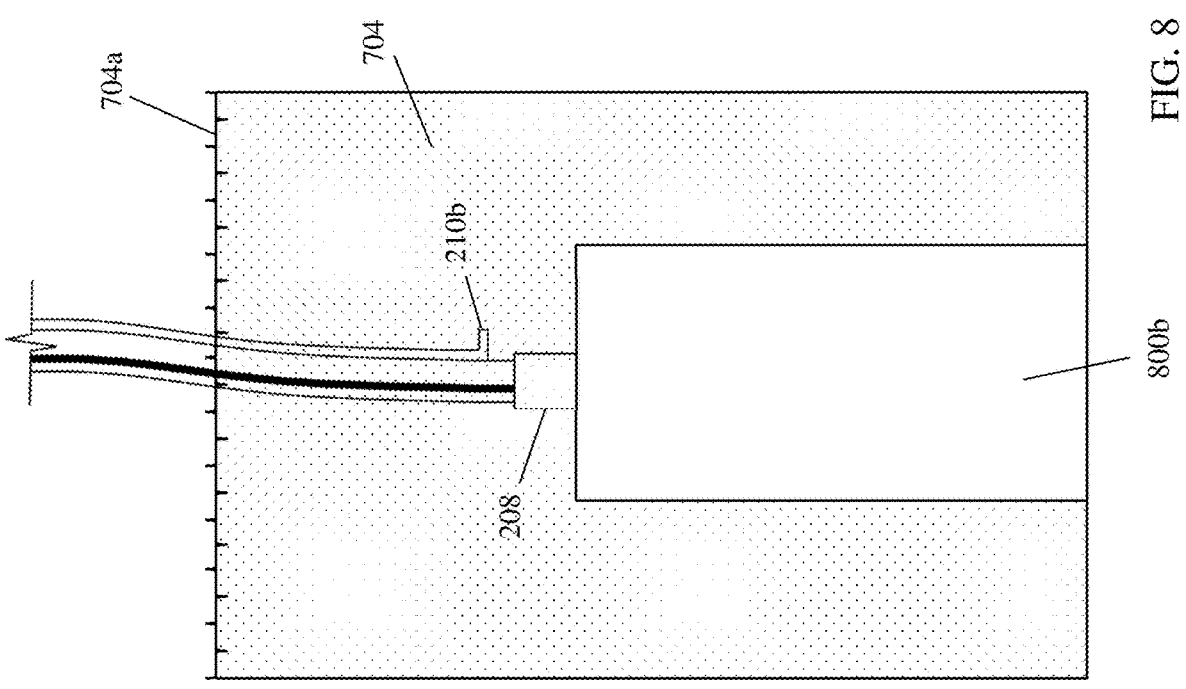
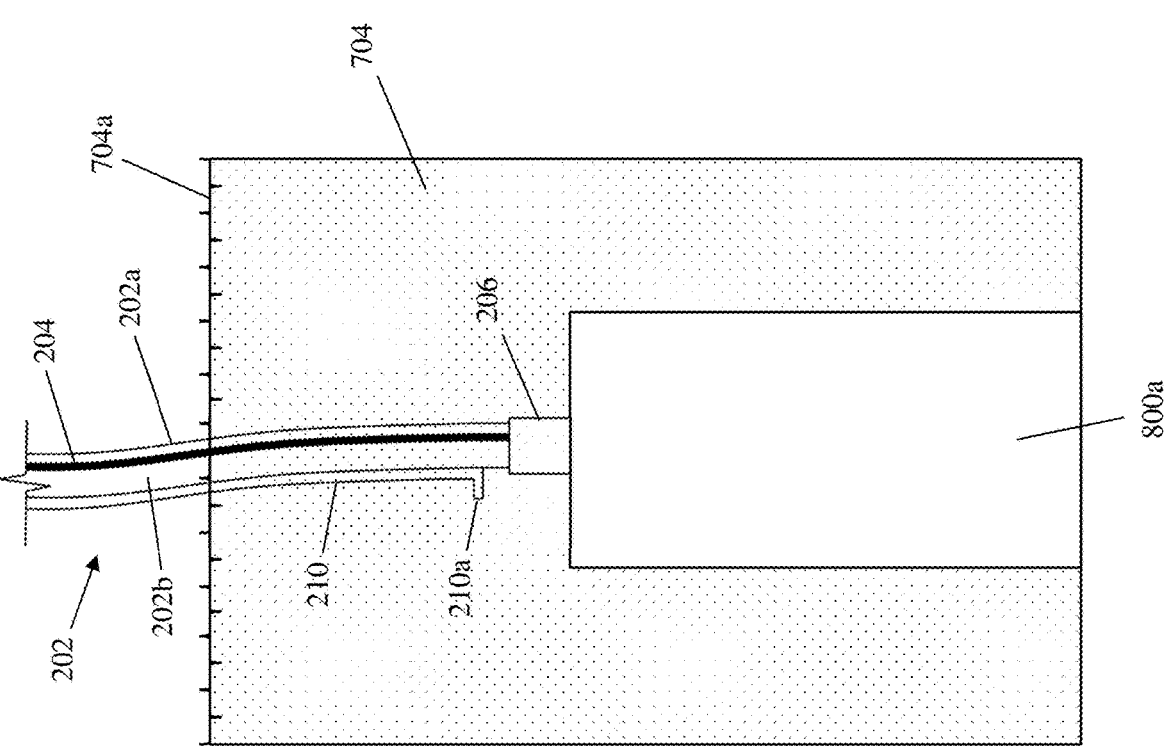
FIG. 8

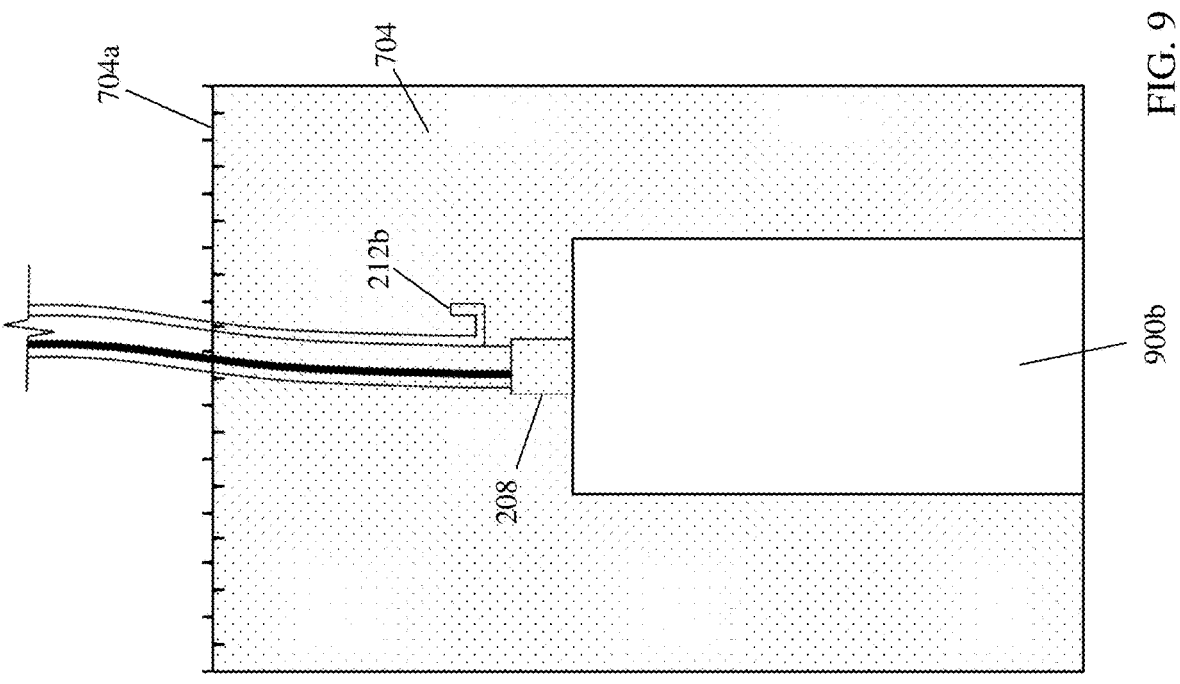
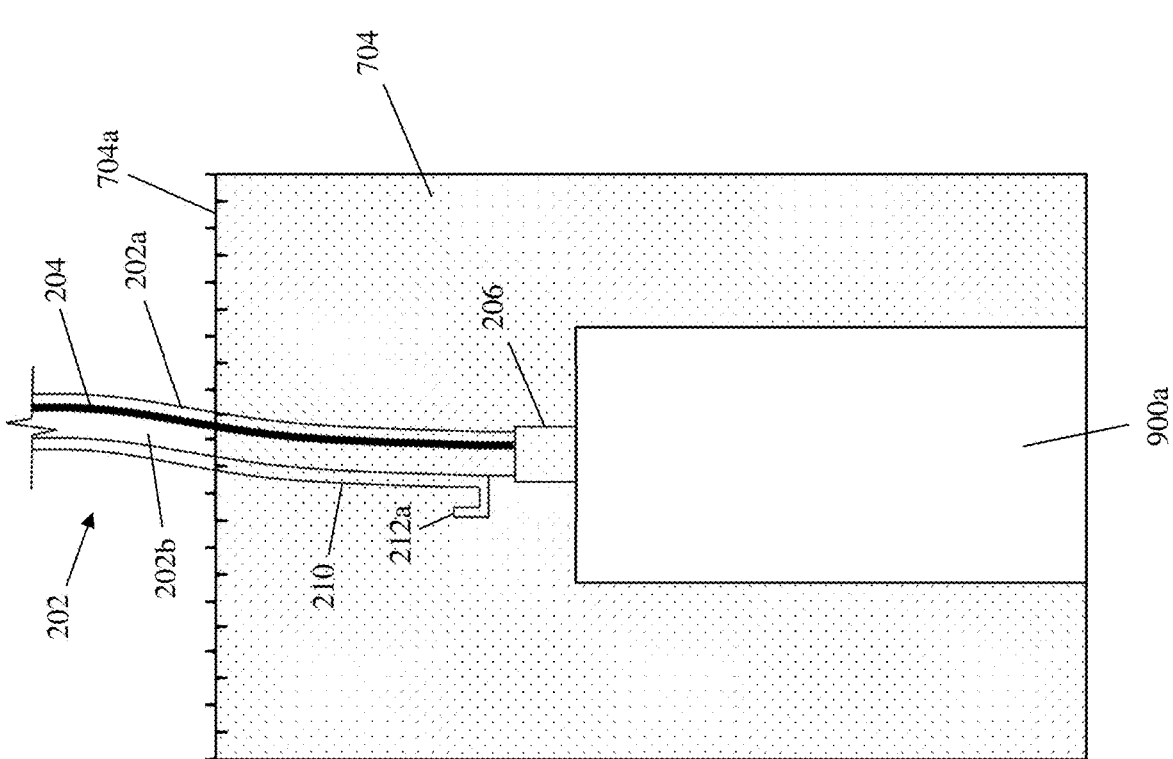
FIG. 9

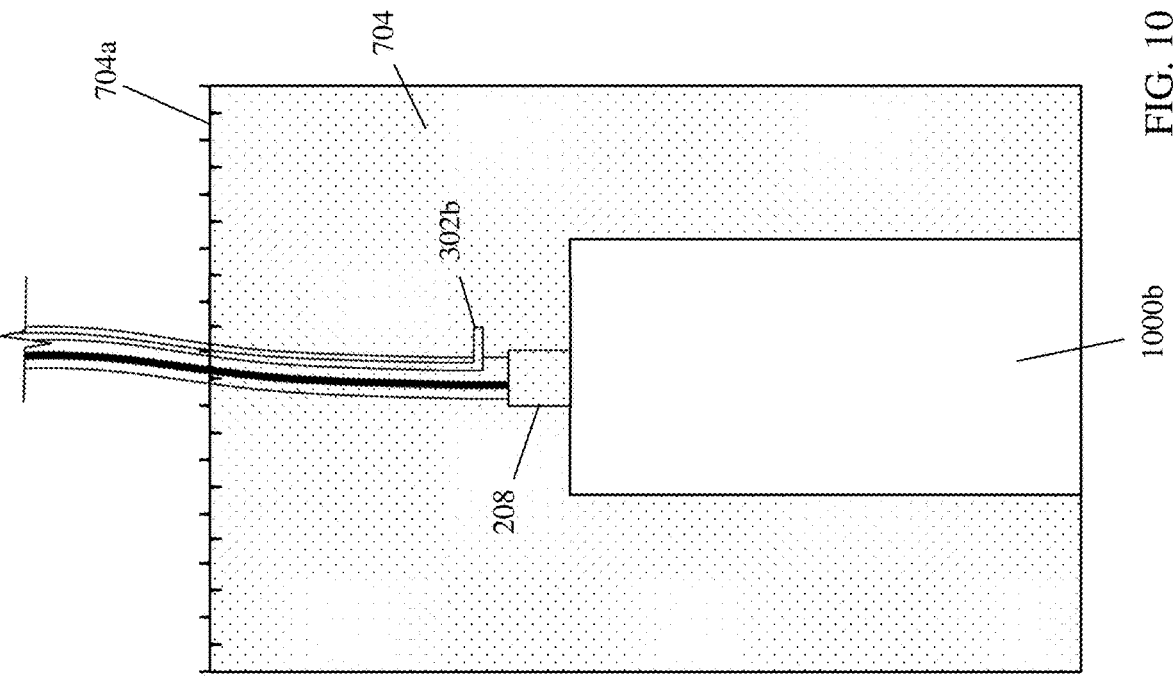
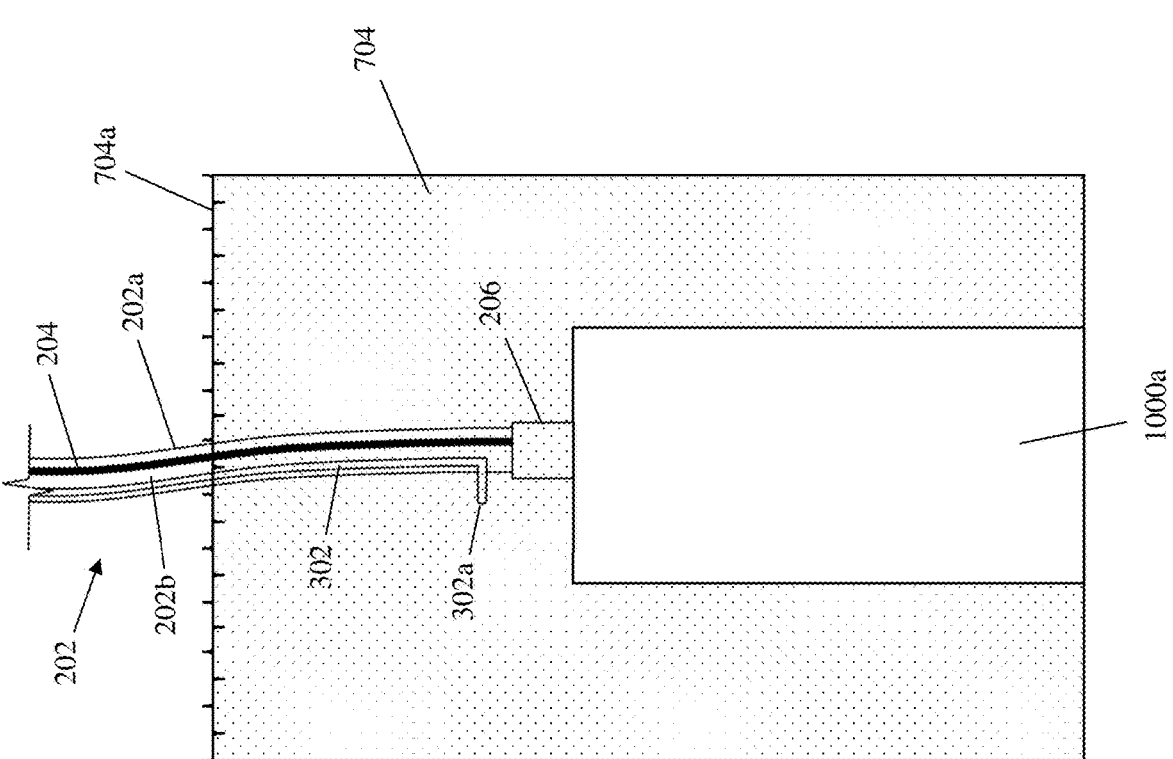
FIG. 10

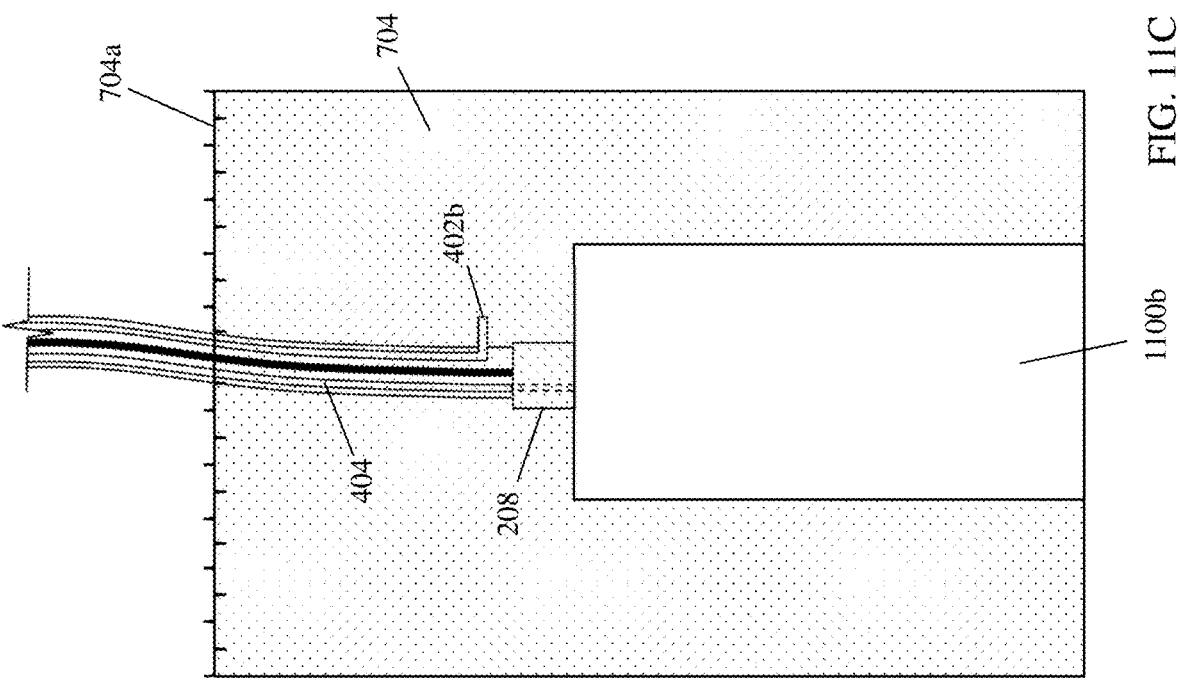
FIG. 11C
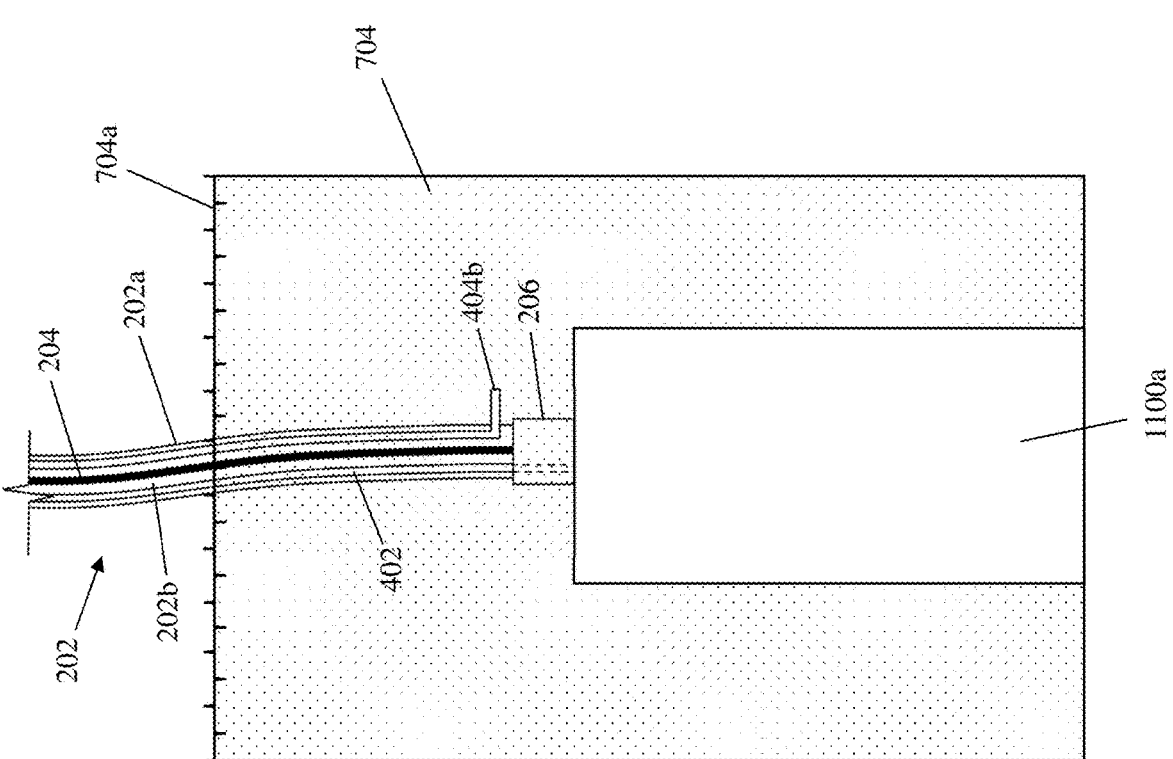

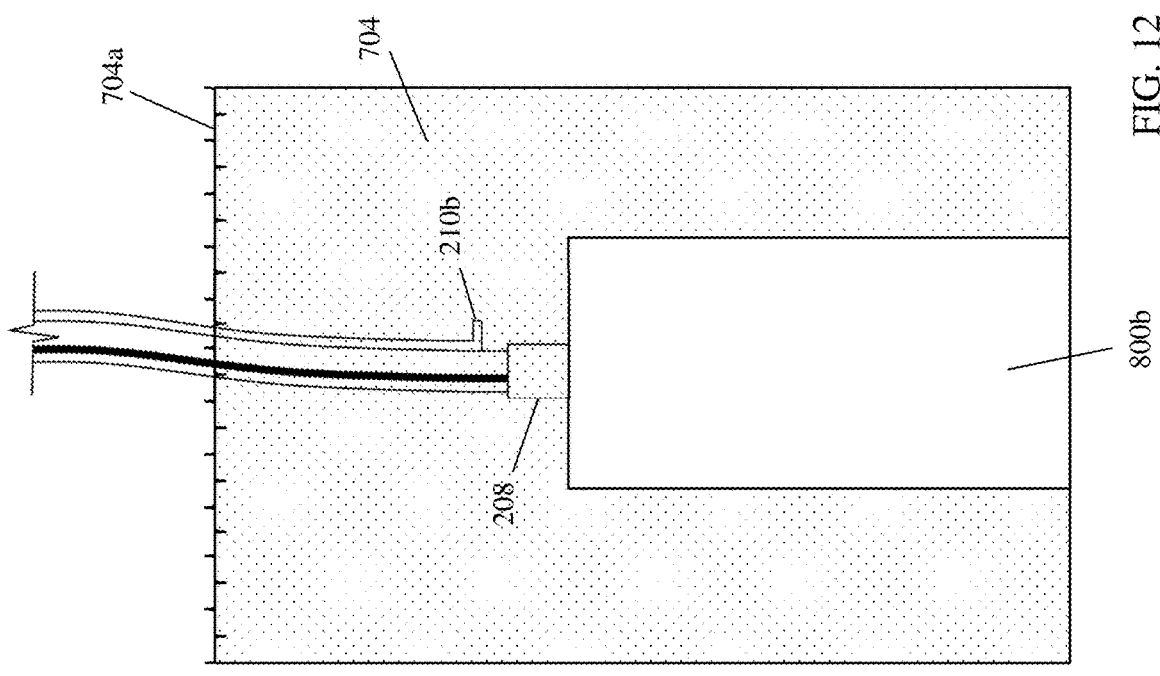
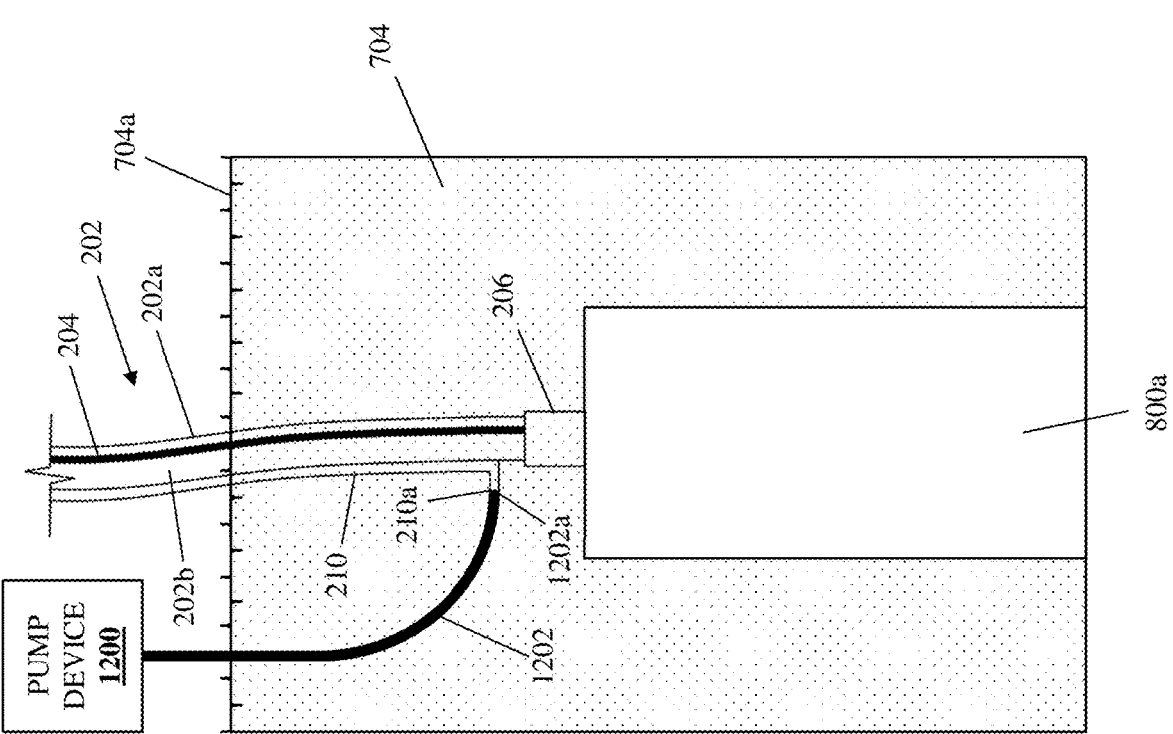
FIG. 12

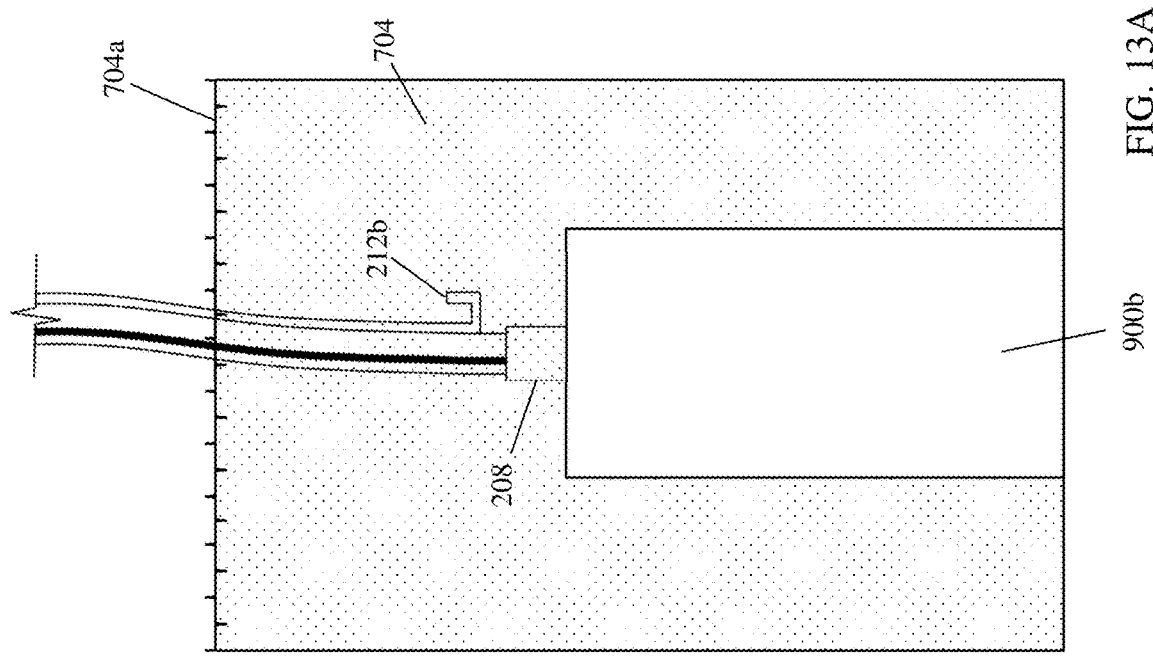
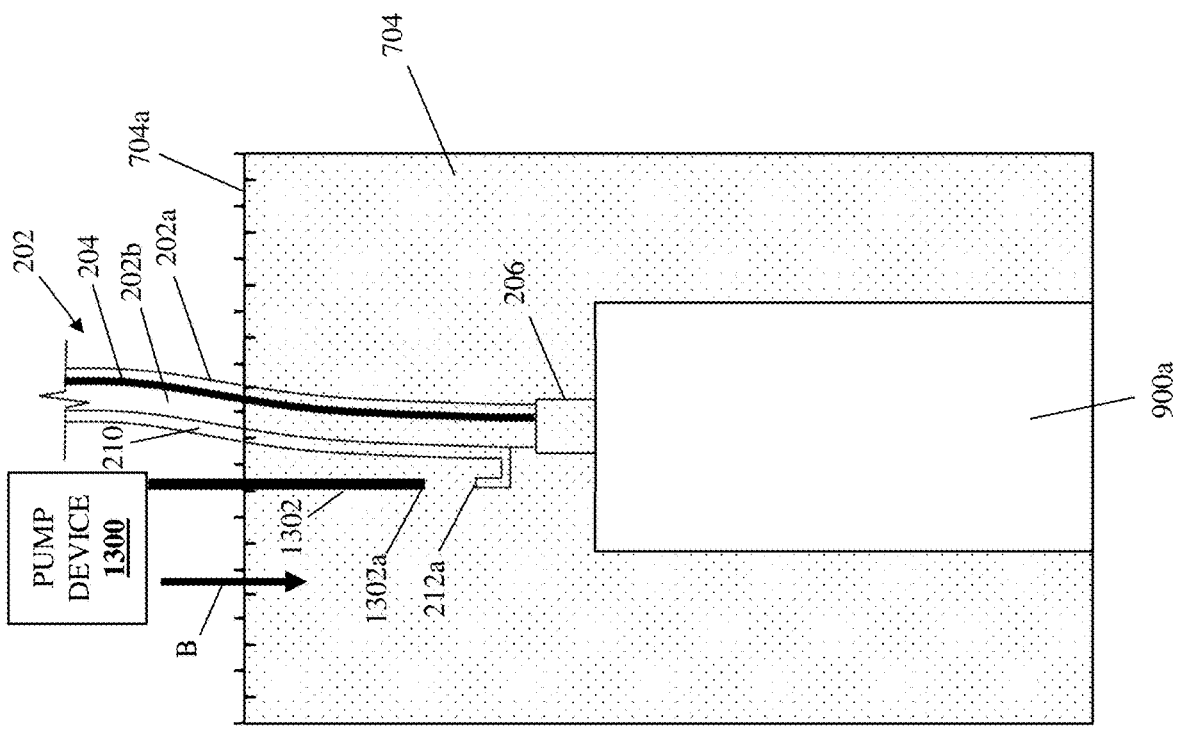
FIG. 13A

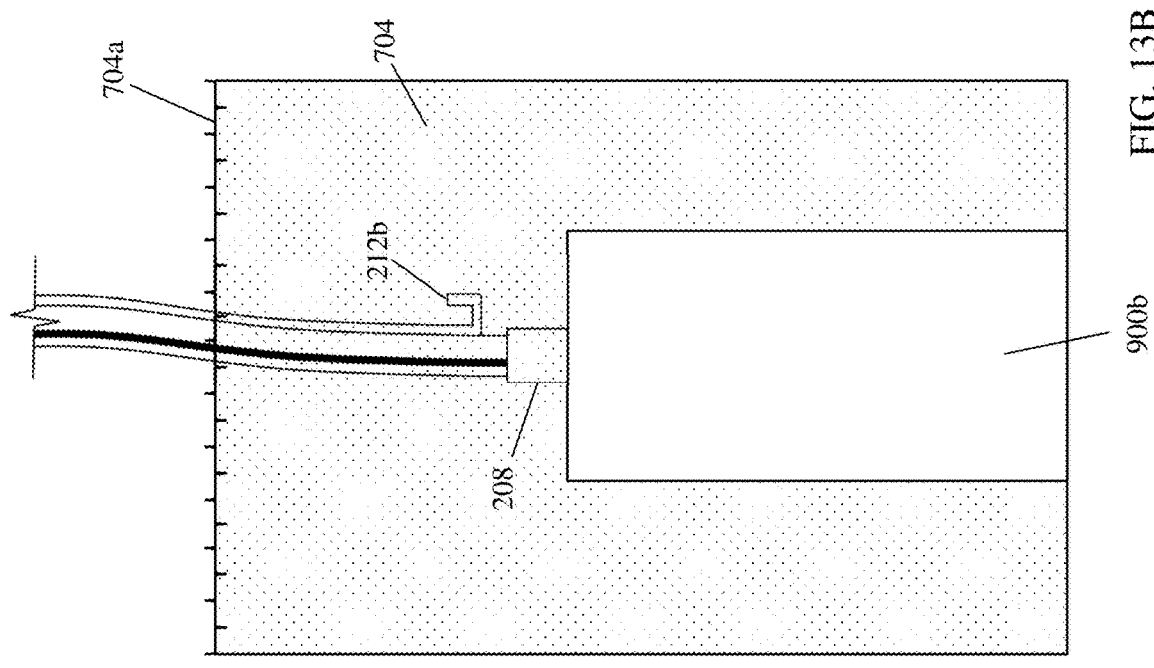
FIG. 13B
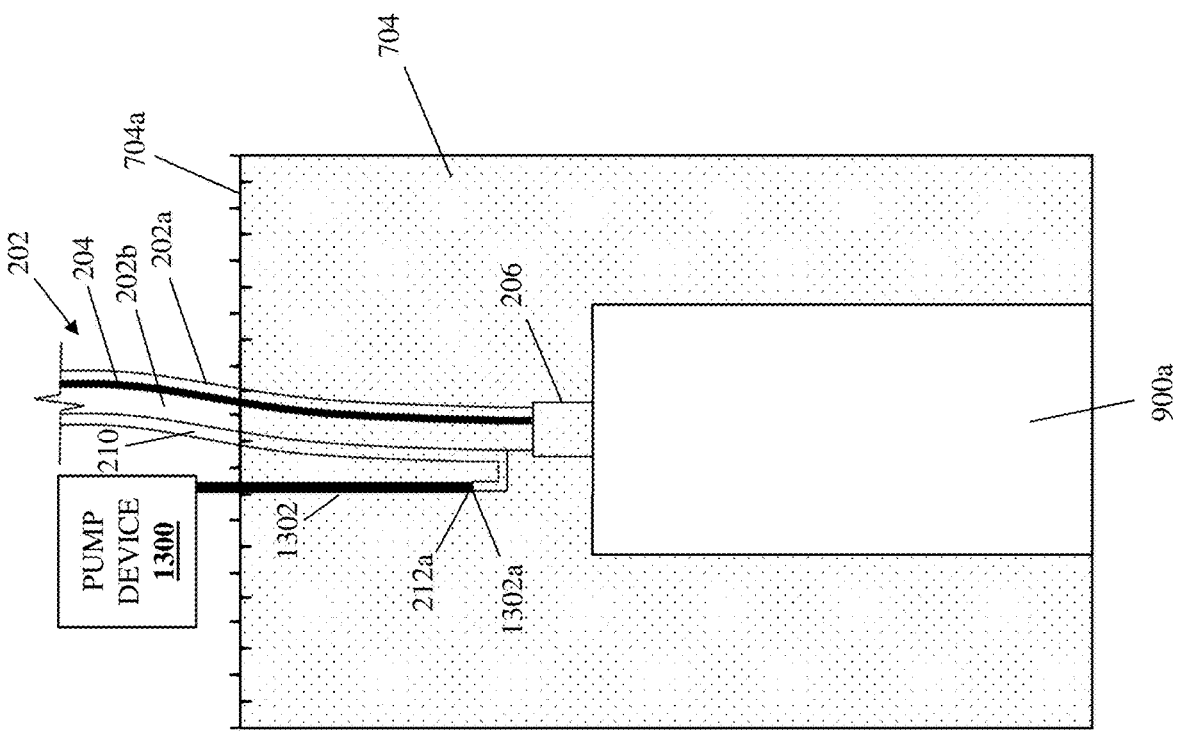

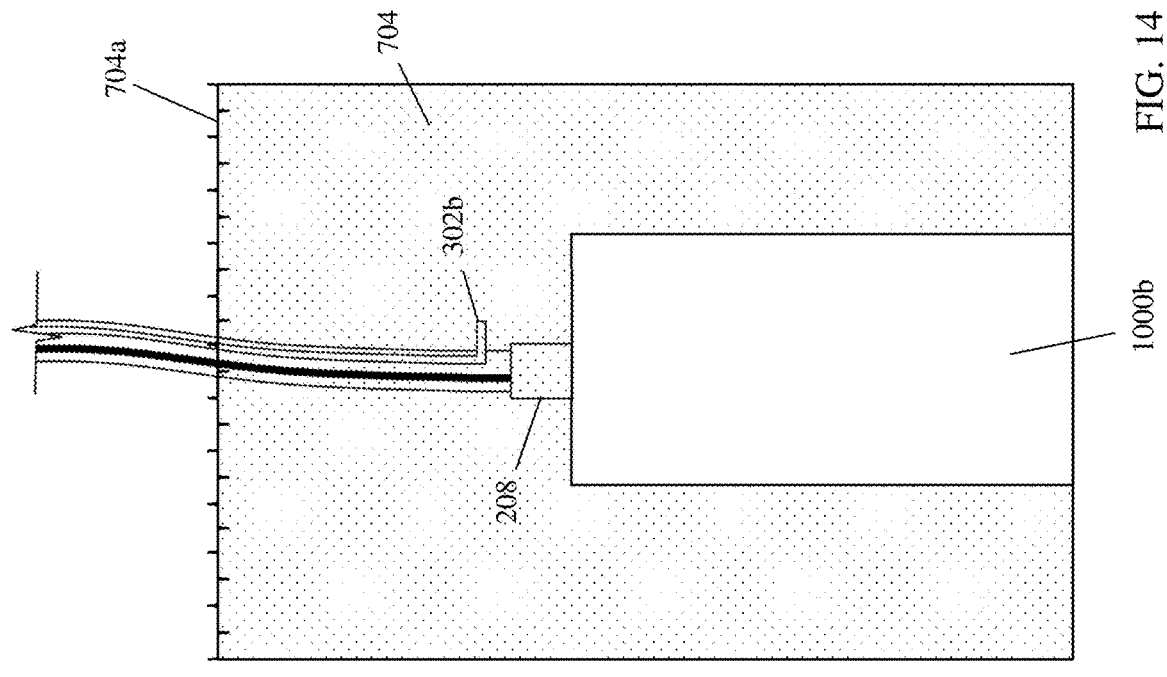
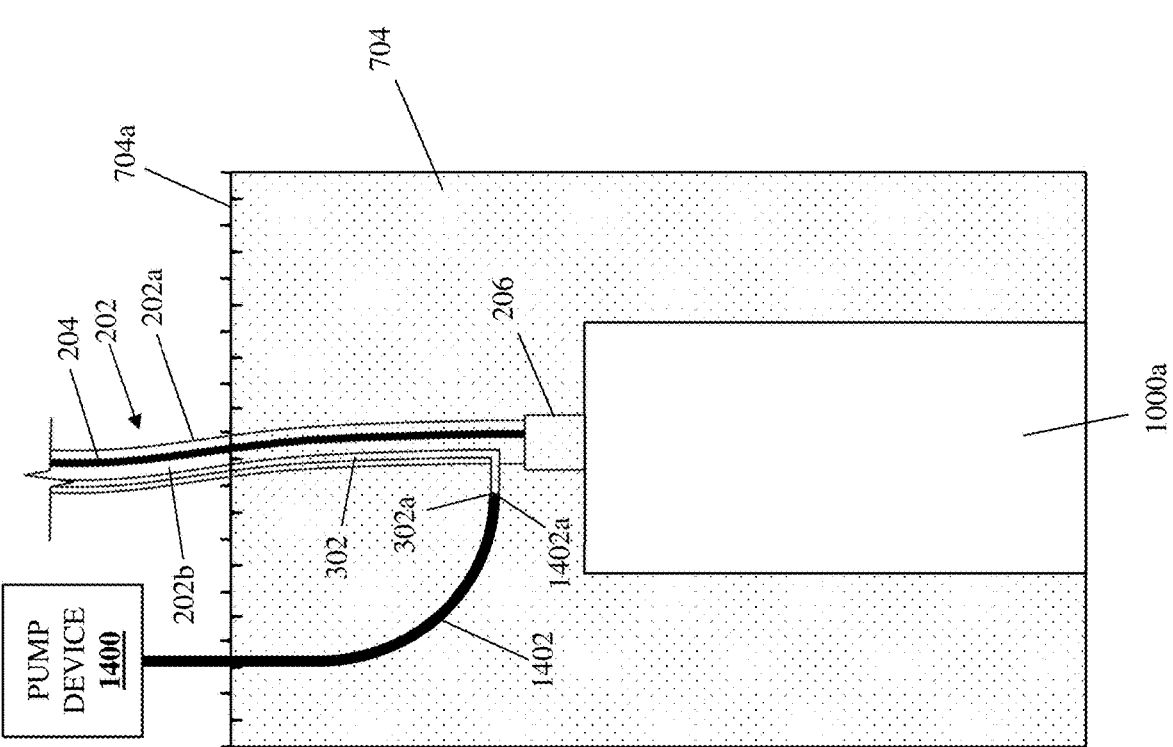
FIG. 14

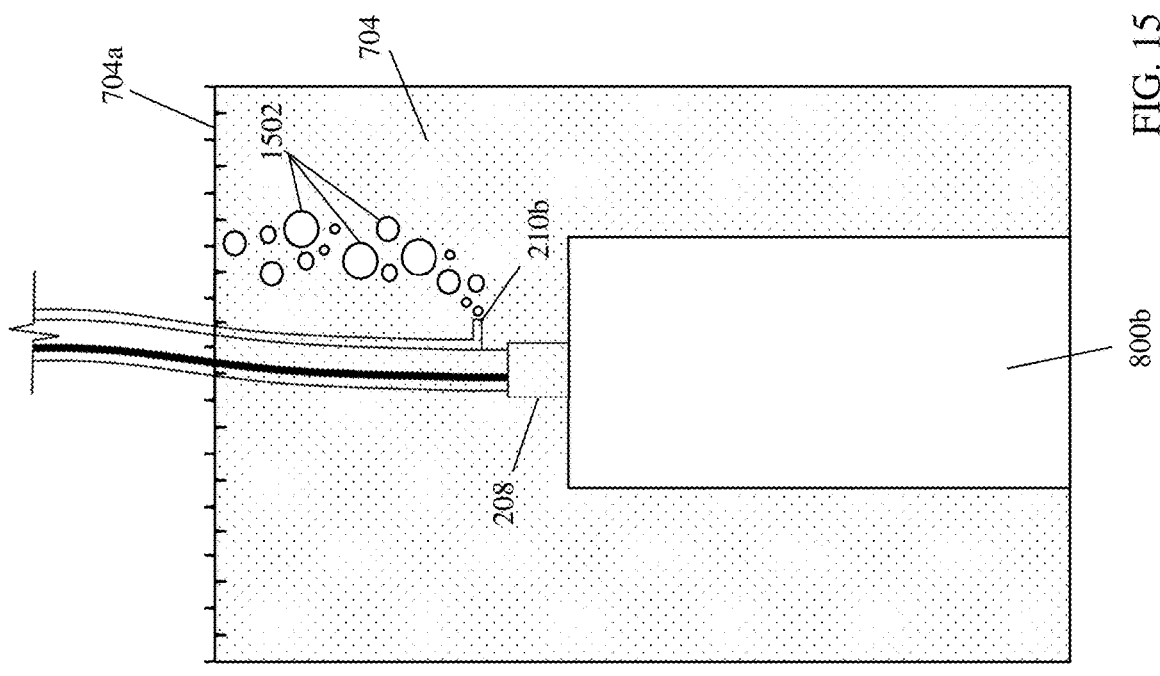
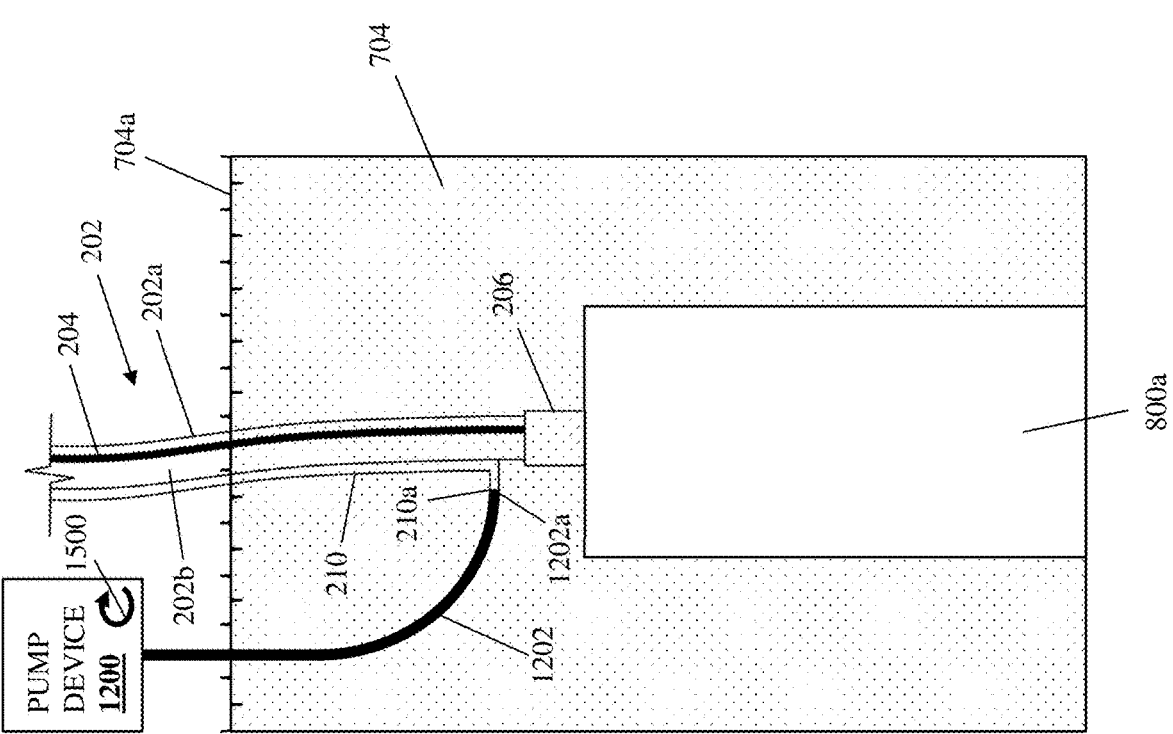
FIG. 15

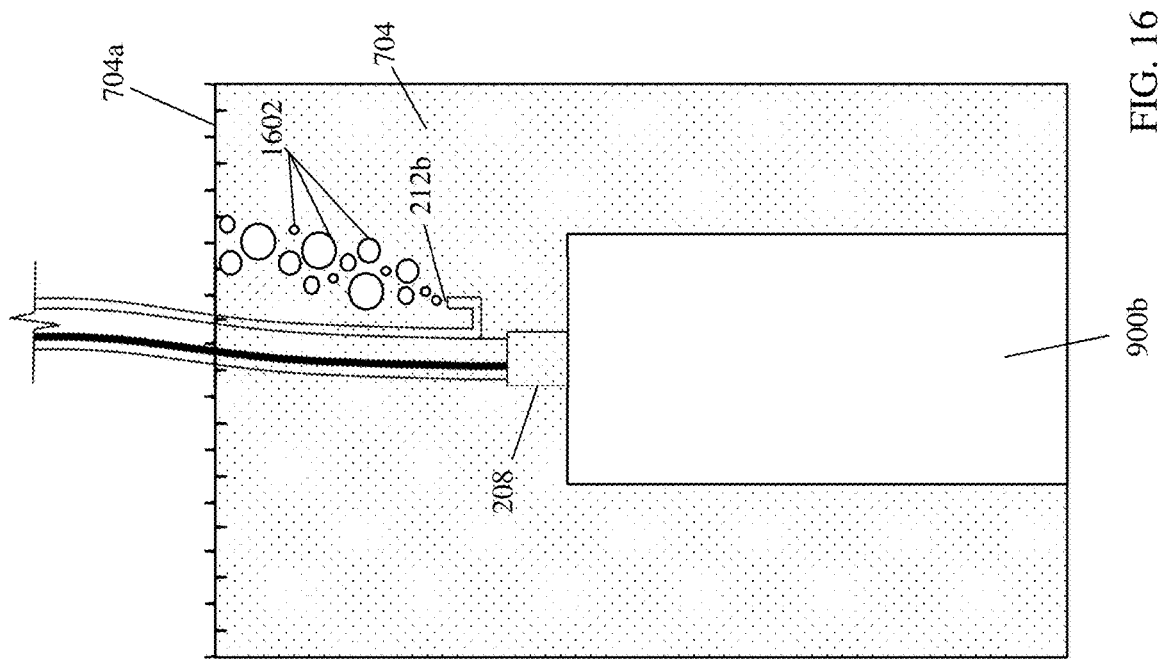
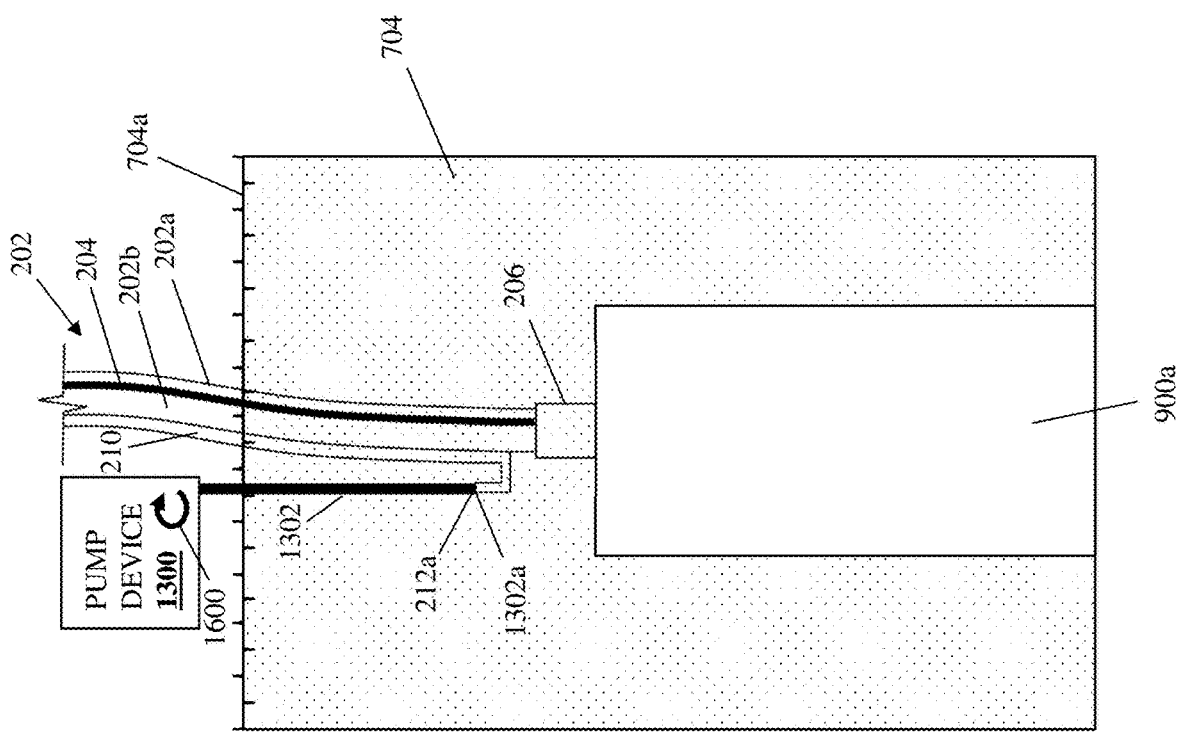
FIG. 16

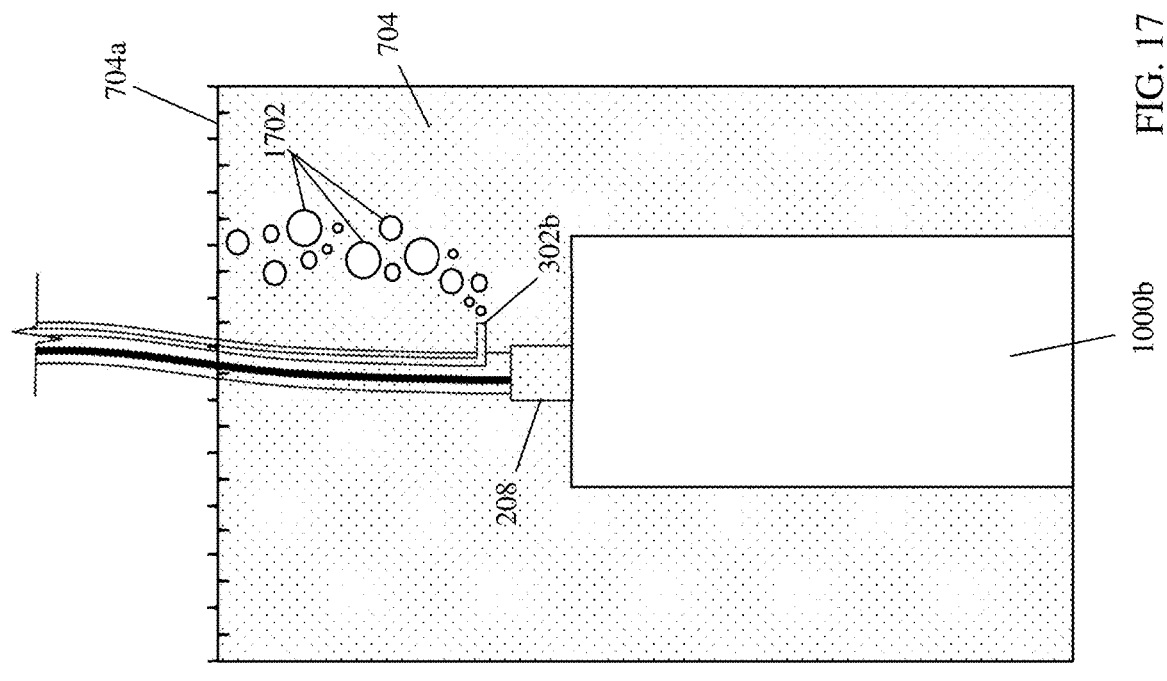
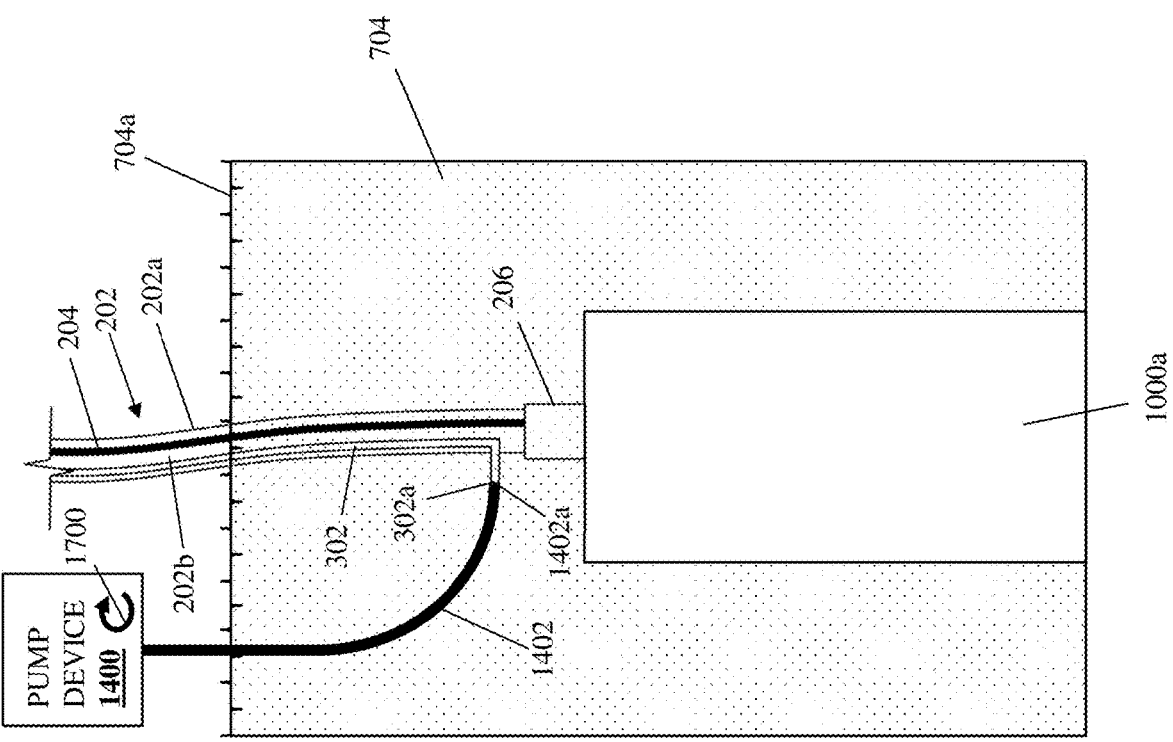
FIG. 17

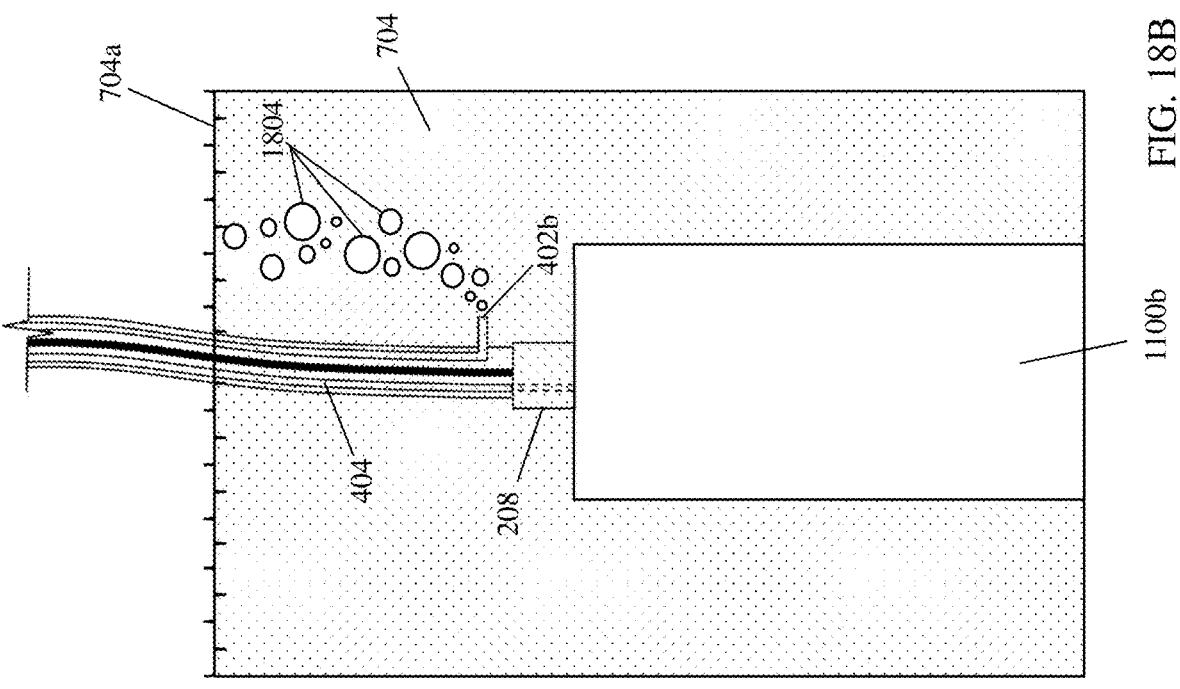
FIG. 18B
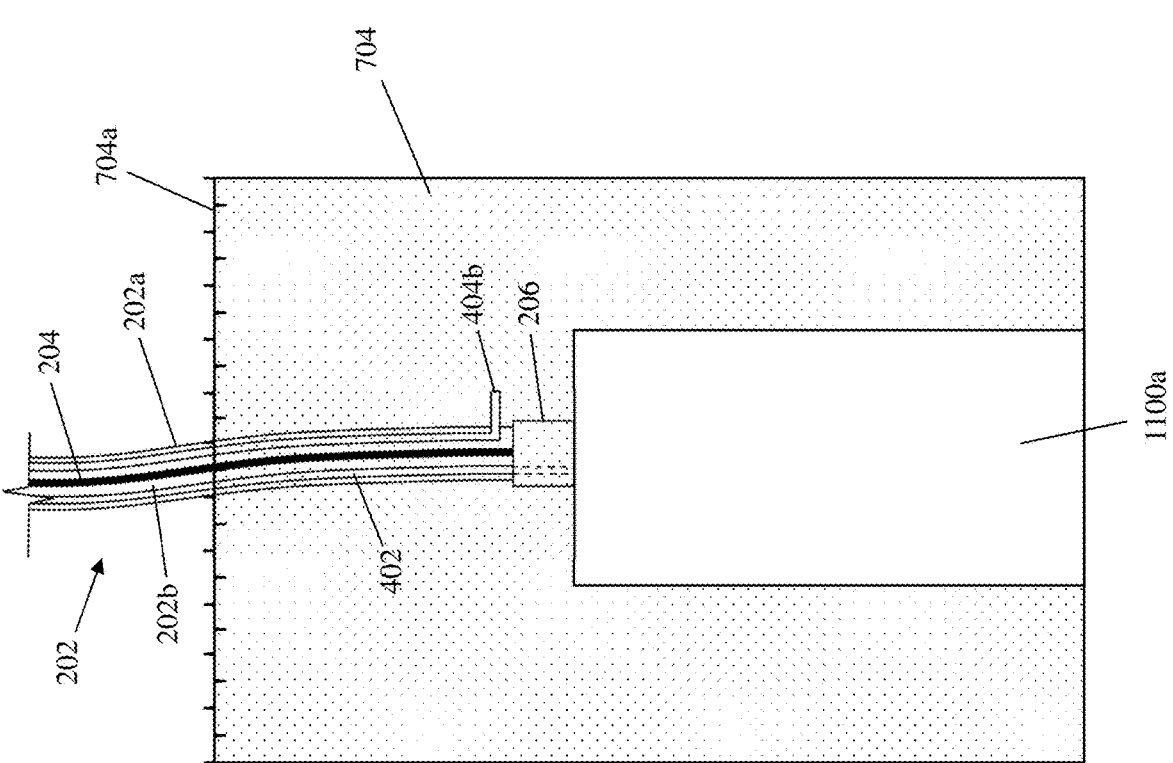

IMMERSION COOLING CABLE TRACING SYSTEM

BACKGROUND

The present disclosure relates generally to information handling systems, and more particularly to tracing cables connected to information handling systems that are cooled using immersion cooling techniques.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As information handling systems such as, for example, networking devices (e.g., switch devices), server devices, and/or other computing devices known in the art, are provided in denser and denser configurations and continue to generate higher and higher amounts of heat during their operation, traditional air-cooling techniques are becoming insufficient to properly cool those computing devices and their components. One solution to such issues is immersion cooling techniques that immerse the computing devices in a dielectric, electrically non-conductive immersion fluid that has a significantly higher thermal conductivity than air, with heat removed from the immersed computing devices by allowing the immersion fluid to directly contact the heat producing components in the computing devices while circulating the heated immersion fluid through heat exchangers.

While immersion cooling techniques are highly effective due to the ability of the immersion fluid to absorb relatively large amounts of heat while being relatively easy to circulate, they do raise issues with regard to the tracing of cables used to connect the computing devices in immersion cooling systems in order to, for example, identify a particular cable connected to computing device(s) in the immersion cooling system, trouble shoot connectivity issues with computing device(s) in the immersion cooling system, and/or other cable tracing situations that would be apparent to one of skill in the art in possession of the present disclosure. As will be appreciated by one of skill in the art in possession of the present disclosure, most cable tracing issues that exist in air cooled systems also exist in immersion cooled systems (cables may be bundled together (e.g., using cable ties) along their lengths as they are routed between their connections to computing devices, and must be unbundled to perform cable tracing), with added issues associated with the immersion of the cables in the immersion fluid that can further complicate the identification of any particular cable being traced due to surface reflection and refraction that limit visibility into the immersion fluid, as well as other immersion fluid issues that would be apparent to one of skill in the art in possession of the present disclosure.

Accordingly, it would be desirable to provide an immersion cooling cable tracing system that addresses the issues discussed below.

SUMMARY

According to one embodiment, an Information Handling System (IHS) includes a chassis that is immersed in an immersion fluid; a communication system that is housed in the chassis and that includes a communication port that is accessible on the chassis; a processing system that is housed in the chassis and that is coupled to the communication port; a data cable; a first connector that is included on a first end of the data cable and that is connected to the communication port; and an air conduit that is included on the data cable, that extends along a length of the data cable, that includes an air inlet that is configured to receive an airflow, and that includes an air outlet that is located adjacent to the first connector and that is configured to release the airflow received through the air conduit and via the air inlet into the immersion fluid.

BRIEF DESCRIPTION OF THE DRAWINGS

FIG. 2B is a schematic view illustrating an embodiment of an immersion cooling cable tracing system that may be provided according to the teachings of the present disclosure.

FIG. 4 is a schematic view illustrating an embodiment of an immersion cooling cable tracing system that may be provided according to the teachings of the present disclosure.

FIG. 6 is a flow chart illustrating an embodiment of a method for cable tracing in an immersion cooling system.

FIG. 8 is a schematic view illustrating an embodiment of the immersion cooling cable tracing system of FIG. 2A connected to computing devices in the immersion cooling system of FIG. 7.

FIG. 9 is a schematic view illustrating an embodiment of the immersion cooling cable tracing system of FIG. 2B connected to computing devices in the immersion cooling system of FIG. 7.

FIG. 10 is a schematic view illustrating an embodiment of the immersion cooling cable tracing system of FIG. 3 connected to computing devices in the immersion cooling system of FIG. 7.

FIG. 11C is a schematic view illustrating an embodiment of the immersion cooling cable tracing system of FIG. 4 connected to computing devices in the immersion cooling system of FIG. 7.

FIG. 12 is a schematic view illustrating a pump device connected to the immersion cooling cable tracing system of FIG. 2A that is connected to computing devices in the immersion cooling system of FIG. 7.

FIG. 13A is a schematic view illustrating a pump device being connected to the immersion cooling cable tracing system of FIG. 2B that is connected to computing devices in the immersion cooling system of FIG. 7.

FIG. 13B is a schematic view illustrating a pump device connected to the immersion cooling cable tracing system of FIG. 2B that is connected to computing devices in the immersion cooling system of FIG. 7.

FIG. 14 is a schematic view illustrating a pump device connected to the immersion cooling cable tracing system of FIG. 3 that is connected to computing devices in the immersion cooling system of FIG. 7.

FIG. 15 is a schematic view illustrating the pump device operating with the immersion cooling cable tracing system of FIG. 2A that is connected to computing devices in the immersion cooling system of FIG. 7 in order to provide for cable tracing.

FIG. 16 is a schematic view illustrating the pump device operating with the immersion cooling cable tracing system of FIG. 2B that is connected to computing devices in the immersion cooling system of FIG. 7 in order to provide for cable tracing.

FIG. 17 is a schematic view illustrating the pump device operating with the immersion cooling cable tracing system of FIG. 3 that is connected to computing devices in the immersion cooling system of FIG. 7 in order to provide for cable tracing.

FIG. 18B is a schematic view illustrating the pump device in the computing device of FIG. 5 operating with the immersion cooling cable tracing system of FIG. 4 that is connected to computing devices in the immersion cooling system of FIG. 7 in order to provide for cable tracing.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
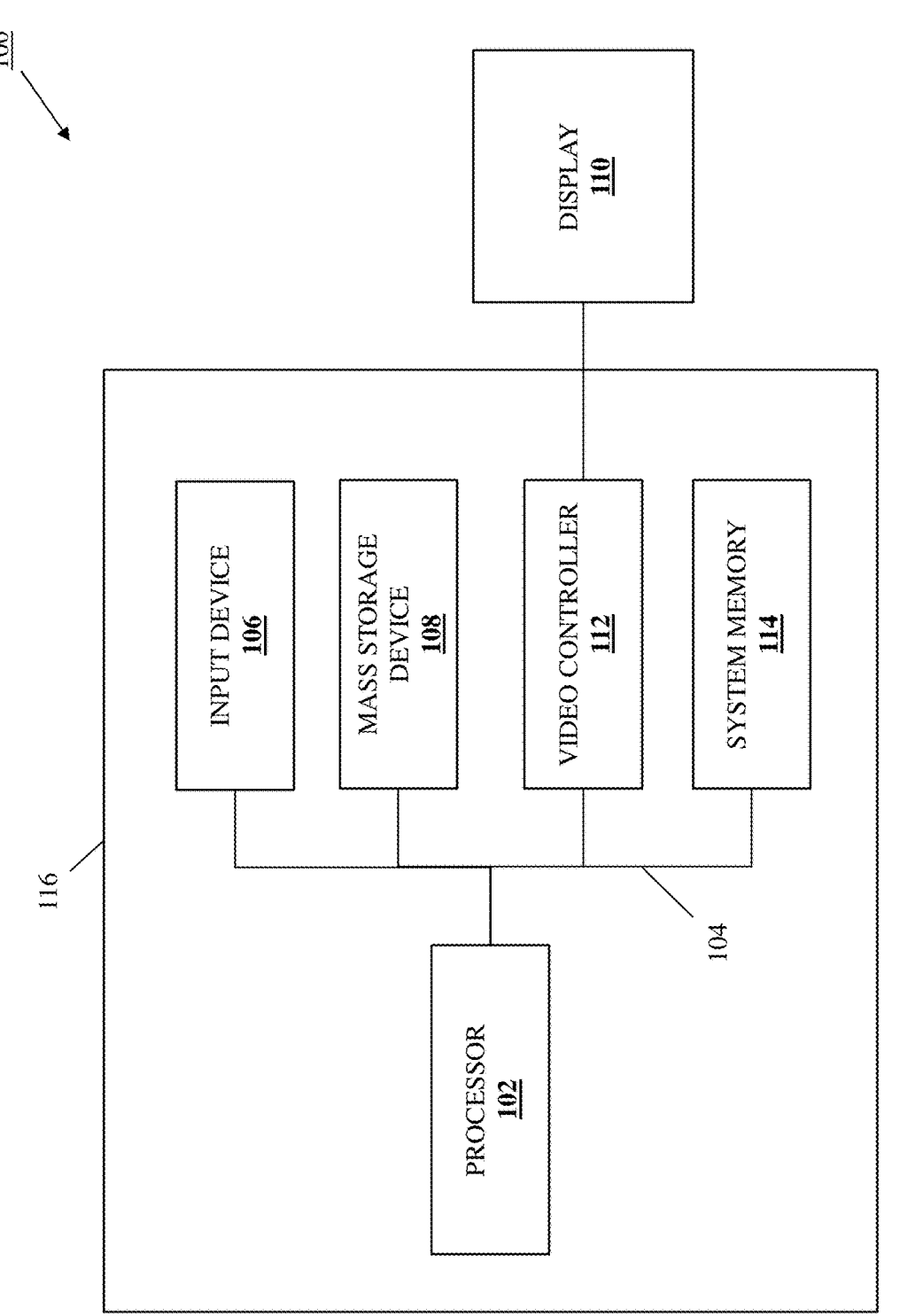
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
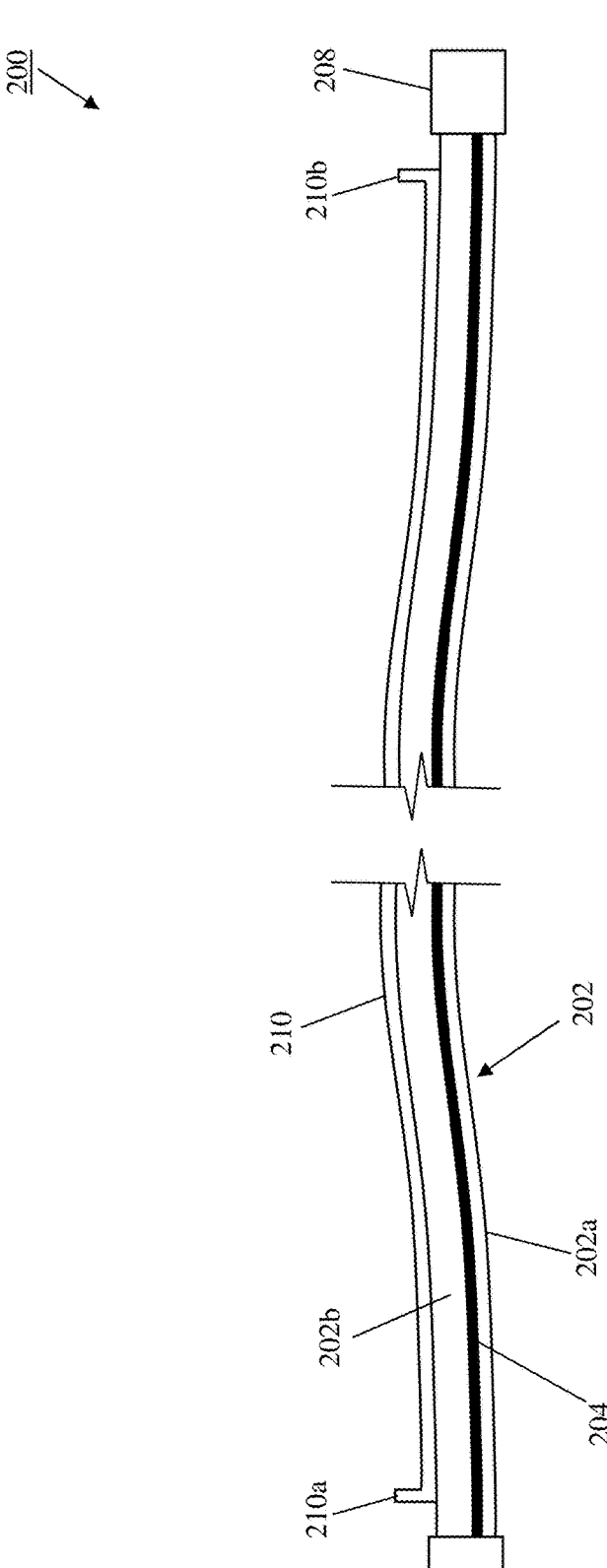
FIG. 2A is a schematic view illustrating an embodiment of an immersion cooling cable tracing system that may be provided according to the teachings of the present disclosure.

Referring now to FIG. 2A, an embodiment of an immersion cooling cable tracing system 200 is illustrated that may be provided according to the teachings of the present disclosure. In the illustrated embodiment, the immersion cooling cable tracing system 200 includes a data cable 202 that one of skill in the art in possession of the present disclosure will appreciate may be provided by a fiber optic data cable, a copper/electrical data cable (e.g., a Direct Attach Copper (DAC) cable in some of the examples provided below), and/or any other data cable technology known in the art. The data cable 202 includes an outer surface 202a along its length, and an interior 202b that is bounded by the outer surface 202a. In the illustrated example, a data conduit 204 extends along the length of the data cable 202 and through the interior 202a of the data cable 202, and may be provided by optical fibers, copper/electrical wires, and/or other data conduits that would be apparent to one of skill in the art in possession of the present disclosure. Furthermore, while not illustrated for clarity or described in detail below, one of skill in the art in possession of the present disclosure will appreciate how the interior 202b of the data cable 202 may include insulation materials, cladding materials, shielding materials, jacket materials, and/or any other data cable components that would be apparent to one of skill in the art in possession of the present disclosure.

As illustrated, a first connector 206 may be included on a first end of the data cable 202, while a second connector 208 may be included on a second end of the data cable 202 that is opposite the data cable 202 from the first end. However, while a data cable having a single connector on each end is illustrated and described, one of skill in the art in possession of the present disclosure will appreciate how the teachings of the present disclosure may be applied to data cables with multiple connectors on either of its ends (e.g., "breakout" cables) while remaining within the scope of the present disclosure as well. To provide some specific examples, the first and second connectors 206 and 208 on the data cable 202 may be provided by DAC connectors, Fibre Optic (FC) connectors, and/or any other data cable connectors on data cables that one of skill in the art in possession of the present disclosure will appreciate may be used with immersion cooling systems like those discussed below.

In the embodiment illustrated in FIG. 2A, an air conduit 210 is provided on the outer surface 202a of the data cable 202 and extends along the length of the data cable 202, with an air inlet/outlet 210a included on a first end of the air conduit 210 adjacent to and spaced apart from the first connector 206, and an air inlet/outlet 210b included on a second end of the air conduit 210 that is opposite the air conduit 210 from the first end and adjacent to and spaced apart from the second connector 208. As will be appreciated by one of skill in the art in possession of the present disclosure, either of the pair of air inlet/outlets 210a and 210b on the air conduit 210 may operate as an air inlet while the other operates as an air outlet. In some embodiments, the air conduit 210 and its air inlet/outlets 210a and 210b may be integrated with the data cable 202 (e.g., manufactured as part of the jacket or other component on the data cable 202 such that it is not easily removeable from the data cable without disassembly of the data cable using tools). However, in other embodiments, the air conduit 210 and its air inlet/outlets 210a and 210b may be configured to be mounted, connected, adhered, and/or otherwise coupled to a conventional data cable. As such, one of skill in the art in possession of the present disclosure will appreciate how a variety of techniques may be utilized to provide the air conduit 202 and its air inlet/outlets 210a and 210b on the data cable 202 while remaining within the scope of the present disclosure.

As will be appreciated by one of skill in the art in possession of the present disclosure, the air inlet/outlet 210a, air conduit 210, and air inlet/outlet 210a may be configured to allow the airflow discussed below to be generated and provided to either of the air inlet/outlets 210a or 210b such that that airflow is transmitted via the air conduit 210 to the other of the air inlet/outlets 210a or 210b, and thus the air channel defined by the air conduit 210 and air inlet/outlets 210a and 210b may be sized to ensure the immersion cooling cable tracing functionality described below. In the specific example illustrated in FIG. 2A, the air inlet/outlets 210a and 210b are each oriented such that they will be directed parallel to the surface of an immersion fluid when their adjacent connector engages a computing device port on a computing device that is immersed in that immersion fluid, but one of skill in the art in possession of the present disclosure will appreciate how other air inlet/outlet orientations will fall within the scope of the present disclosure as well.

For example, with reference to FIG. 2B, an embodiment of the immersion cooling cable tracing system 200 is illustrated with the air inlet/outlets 210a and 210b illustrated and discussed above with reference to FIG. 2A replaced with air inlet/outlets 212a and 212b, respectively, on the first end and second end of the air conduit 210. As will be appreciated by one of skill in the art in possession of the present disclosure, either of the pair of air inlet/outlets 212a and 212b on the air conduit 210 may operate as an air inlet while the other operates as an air outlet. In the specific example illustrated in FIG. 2B, the air inlet/outlets 212a and 212b are each oriented such that they will be directed towards the surface of an immersion fluid when their adjacent connector engages a computing device port on a computing device that is immersed in that immersion fluid. In some embodiments, the air inlet/outlets 212a and 212b may be fixed in the orientation illustrated in FIG. 2B. However, in other embodiments, the air conduit 210 may be provided with moveable/flexible/reconfigurable air inlet/outlets that may be reconfigured from the orientation of the air inlet/outlets 210a and 210b illustrated in FIG. 2A to the orientation of the air inlet/outlets 212a and 212b illustrated in FIG. 2B. As such, "bendable" air inlet/outlets, hinged air inlet/outlets, and/or any of a variety of removeable/flexible/reconfigurable air inlet/outlets may be provided on the air conduit 210 to allow the air inlet/outlets to be directed in a desired manner while remaining within the scope of the present disclosure.

Figure 3:
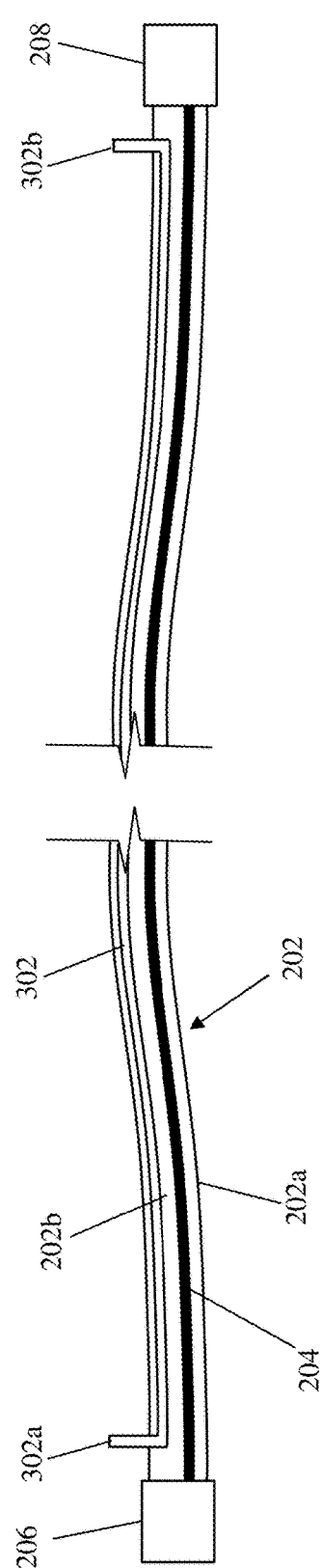
FIG. 3 is a schematic view illustrating an embodiment of an immersion cooling cable tracing system that may be provided according to the teachings of the present disclosure.

With reference to FIG. 3, another embodiment of an immersion cooling cable tracing system 300 is illustrated that is similar to the immersion cooling cable tracing system 200 discussed above with reference to FIG. 2A (with similar elements including the same element numbers), but with the air conduit 210 and its air inlet/outlets 210a and 210b replaced with an air conduit 302 and air inlet/outlets 302a and 302b. As will be appreciated by one of skill in the art in possession of the present disclosure, either of the pair of air inlet/outlets 302a and 302b on the air conduit 302 may operate as an air inlet while the other operates as an air outlet. In the specific example illustrated in FIG. 3, the air conduit 302 is provided in the interior 202b of the data cable 202 and extends along the length of the data cable 202, with the air inlet/outlet 302a included on a first end of the air conduit 302 and extending from the interior 202b of the data cable 202 and from the outer surface 202a of the data cable 202 adjacent to and spaced apart from the first connector 206, and the air inlet/outlet 302b included on a second end of the air conduit 302 that is opposite the air conduit 302 from the first end and extending from the interior 202b of the data cable 202 and out from the outer surface 202a of the data cable 202 adjacent to and spaced apart from the second connector 208.

As such, one of skill in the art in possession of the present disclosure will appreciate how the air conduit 302 may be bounded by insulation materials, cladding materials, shielding materials, jacket materials, and/or any other data cable components that provide the interior 202b of the data cable 202. Similarly as described above, one of skill in the art in possession of the present disclosure will appreciate how the air inlet/outlet 302a, air conduit 302, and air inlet/outlet 302b may be configured to allow the airflow discussed below to be generated and provided to either of the air inlet/outlets 302a or 302b such that that airflow is transmitted via the air conduit 302 to the other of the air inlet/outlets 302a or 302b, and thus the air channel defined by the air conduit 302 and air inlet/outlets 302a and 302b may be sized to ensure the immersion cooling cable tracing functionality described below.

Furthermore, while the air inlet/outlets 302a and 302b are each oriented similarly as described above for the air inlet/outlets 210a and 210b of FIG. 2A such that they will be directed parallel to the surface of an immersion fluid when their adjacent connector engages a computing device port on a computing device that is immersed in that immersion fluid, one of skill in the art in possession of the present disclosure will appreciate how the air inlet/outlets 302a and 302b may be oriented similarly as (or reconfigurable into an orientation similar to that) described above for the air inlet/outlets 212a and 212b of FIG. 2B such that they are directed towards the surface of an immersion fluid when their adjacent connector engages a computing device port on a computing device that is immersed in that immersion fluid while remaining within the scope of the present disclosure as well.

With reference to FIG. 4, another embodiment of an immersion cooling cable tracing system 400 is illustrated that is similar to the immersion cooling cable tracing system 200 discussed above with reference to FIG. 2A (with similar elements including the same element numbers), but with the air conduit 210 and its air inlet/outlets 210a and 210b replaced with a first air conduit 402 having an air inlet 402a and an air outlet 402b, and a second air conduit 404 having an air inlet 404a and an air outlet 404b. In the specific example illustrated in FIG. 4, the air conduit 402 is provided in the interior 202b of the data cable 202 and extends along the length of the data cable 202 and through the first connector 206, with the air inlet 402a included on a first end of the air conduit 402 and extending from the first connector 206, and the air outlet 402b included on a second end of the air conduit 402 that is opposite the air conduit 402 from the first end and extending from the interior 202b of the data cable 202 and out from the outer surface 202a of the data cable 202 adjacent to and spaced apart from the second connector 208. As such, one of skill in the art in possession of the present disclosure will appreciate how the air conduit 402 may be bounded by insulation materials, cladding materials, shielding materials, jacket materials, and/or any other data cable components that provide the interior 202b of the data cable 202.

Similarly, the specific example illustrated in FIG. 4 includes the air conduit 404 provided in the interior 202b of the data cable 202 and extending along the length of the data cable 202 and through the second connector 208, with the air inlet 404a included on a second end of the air conduit 404 and extending from the second connector 208, and the air outlet 404b included on a first end of the air conduit 404 that is opposite the air conduit 404 from the second end and extending from the interior 202b of the data cable 202 and out from the outer surface 202a of the data cable 202 adjacent to and spaced apart from the first connector 206. As such, one of skill in the art in possession of the present disclosure will appreciate how the air conduit 404 may be bounded by insulation materials, cladding materials, shielding materials, jacket materials, and/or any other data cable components that provide the interior 202b of the data cable 202.

Similarly as described above, one of skill in the art in possession of the present disclosure will appreciate how the air inlet 402a/air conduit 402/air outlet 402b and the air inlet 404a/air conduit 404/air outlet 404b may be configured to allow the airflow discussed below to be generated and provided to either of the air inlets 402a and 404a such that that airflow is transmitted via the air conduits 402 and 404, respectively, to the air outlets 402b and 404b, respectively, and thus the air channel defined by the air conduits 402 and 404, the air inlets 402a and 404a, and the air outlets 402b and 404b may be sized to ensure the immersion cooling cable tracing functionality described below.

Furthermore, while the air outlets 402b and 404b are each oriented similarly as described above for the air inlet/outlets 210a and 210b of FIG. 2A such that they will be directed parallel to the surface of an immersion fluid when their adjacent connector engages a computing device port on a computing device that is immersed in that immersion fluid, one of skill in the art in possession of the present disclosure will appreciate how the air outlets 402b and 404b may be oriented similarly as (or reconfigurable into an orientation similar to that) described above for the air inlet/outlets 212a and 212b of FIG. 2B such that they will be directed towards the surface of an immersion fluid when their adjacent connector engages a computing device port on a computing device that is immersed in that immersion fluid while remaining within the scope of the present disclosure as well.

Further still, while the air conduits 402 and 404 are illustrated and described as being provided in the interior 202b of the data cable 202, one of skill in the art in possession of the present disclosure will appreciate how the air conduits 402 and 404 may be provided on the outer surface 202a of the data cable 202 similarly as illustrated and described above with reference to FIG. 2A while remaining within the scope of the present disclosure as well. As such, while several specific immersion cooling cable tracing systems have been illustrated and described, one of skill in the art in possession of the present disclosure will recognize that the immersion cooling cable tracing system of the present disclosure may include a variety of components and/or component configurations for providing conventional cabling functionality, as well as the immersion cooling cable tracing functionality discussed below, while remaining within the scope of the present disclosure as well.

Figure 5:
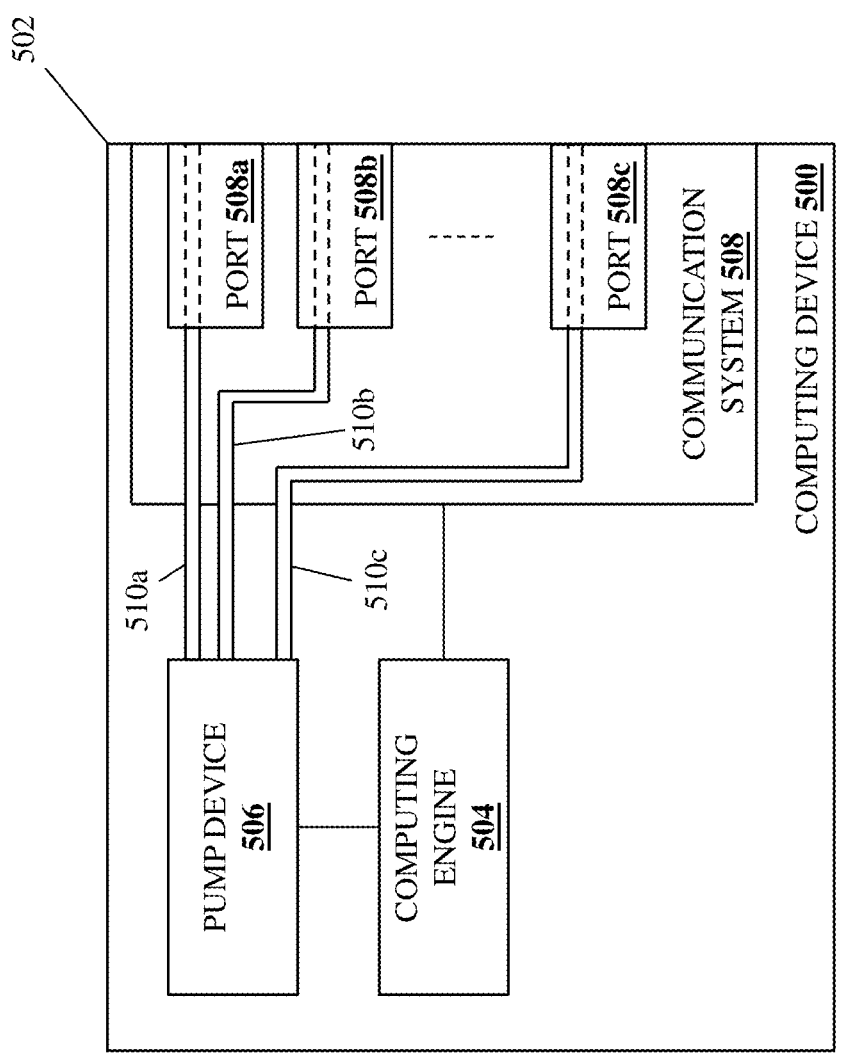
FIG. 5 is a schematic view illustrating an embodiment of a computing device that may be utilized with the immersion cooling cable tracing system of FIG. 4.

Referring now to FIG. 5, an embodiment of a computing device 500 is illustrated that may be used with the immersion cooling cable tracing system 400 discussed above with reference to FIG. 4. In an embodiment, the computing device 500 may be provided by the IHS 100 discussed above with reference to FIG. 1 and/or may include some or all of the components of the IHS 100, and in specific examples may be provided by networking devices such as switch devices, server devices, and/or other computing devices known in the art. Furthermore, while illustrated and discussed as being provided by particular computing devices, one of skill in the art in possession of the present disclosure will recognize that the functionality of the computing device 500 discussed below may be provided by other devices that are configured to operate similarly as the computing device 500 discussed below.

In the illustrated embodiment, the computing device 500 includes a chassis 502 that houses the components of the computing device 500, only some of which are illustrated and described below. For example, the chassis 502 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a computing engine 504 that is configured to perform the functionality of the computing engines and/or computing devices discussed below. As illustrated, the chassis 502 may also house an airflow generation device that, in the example described below, is provided by a pump device 506 that is coupled to the computing engine 504 (e.g., via a coupling between the pump device 506 and the processing system), but that one of skill in the art in possession of the present disclosure will appreciate may be provided by other devices that are configured to generate an airflow while remaining within the scope of the present disclosure as well.

The chassis 302 may also house a communication system 508 that is coupled to the computing engine 504 (e.g., via a coupling between the communication system 308 and the processing system) and that is illustrated as including a plurality of computing device ports 508a, 508b, and up to 508c, and one of skill in the art in possession of the present disclosure will appreciate how the communication system 508 may include any of a variety of other communication components while remaining within the scope of the present disclosure as well. In the illustrated embodiment, a respective air conduit 510a, 510b, and up to 510c extends between the pump device 506 and each of the computing device ports 508a, 508b, and up to 508c, respectively, with each air conduit 510a, 510b, and up to 510c extending through its respective computing device port 508a, 508b, and up to 508c, so that each of those air conduits are configured to engage the air inlets 402a or 404a on the immersion cooling cable tracing system 400 when the first or second connector 206 or 208 on the immersion cooling cable tracing system 400 is connected to that computing device port.

While not illustrated or described in detail, one of skill in the art in possession of the present disclosure will appreciated how some embodiments of the present disclosure may require the computing device 500 to include an air reservoir, air "snorkel"/intake, or other air source access subsystem for use by the pump device 506 when the computing device 500 is immersed in immersion fluid as described below. However, while a specific computing device 500 has been illustrated and described, one of skill in the art in possession of the present disclosure will recognize that computing devices (or other devices operating according to the teachings of the present disclosure in a manner similar to that described below for the computing device 500) may include a variety of components and/or component configurations for providing conventional computing device functionality, as well as the immersion cooling cable tracing functionality discussed below, while remaining within the scope of the present disclosure as well.

Referring now to FIG. 6, an embodiment of a method 600 for cable tracing in an immersion cooling system is illustrated. As discussed below, the systems and methods of the present disclosure provide an airflow conduit on data cables that may be used to transmit airflow received via an airflow inlet along the length of a data cable and to an airflow outlet that releases that airflow into an immersion fluid in which its connected computing device is immersed. For example, the immersion cooling cable tracing system of the present disclosure may include a data cable having a first connector that is included on a first end of the data cable, and a second connector that is included on a second end of the data cable that is opposite the data cable from the first end. An air conduit is included on the data cable, extends along a length of the data cable, that includes an air inlet that is configured to receive an airflow, and an air outlet that is located adjacent to the second connector. The air outlet is configured to release the airflow received through the air conduit and via the air inlet into an immersion fluid when the second connector and the air outlet are immersed in the immersion fluid. As such, data cables that are connected to computing devices immersed in immersion fluid may be easily traced by identifying the airflow being released into the immersion fluid via the immersion cooling cable tracing system that includes that data cable.

Figure 7:
FIG. 7 is a schematic view illustrating an embodiment of an immersion cooling system.

The method 600 begins at block 602 where computing device(s) are immersed in an immersion fluid. With reference to FIG. 7, in an embodiment of block 602, a plurality of immersion cooling racks 700 and up to 702 may be provided, with a plurality of computing devices 700a included in the immersion cooling rack 700 and a plurality of computing devices 702a included in the immersion cooling rack 702, and with an immersion fluid 704 provided in each of the immersion cooling racks 700-702. For example, one of skill in the art in possession of the present disclosure will appreciate how the computing devices 700a and 702a may be provided in their respective immersion cooling racks 700 and 702, and then those immersion cooling racks 700-702 may be filled with the immersion fluid 704 that, as discussed above, may be provided by dielectric, electrically non-conductive immersion fluid that has a significantly higher thermal conductivity than air such that a surface 704a of the immersion fluid 704 is located above the computing devices 700a and 702a. To provide a specific example, the computing devices 700a and 702a may include one or more networking devices (e.g., switch devices) and server devices, although other types and/or combinations of computing devices will fall within the scope of the present disclosure as well.

Furthermore, while not illustrated or described in detail, one of skill in the art in possession of the present disclosure will appreciate how the immersion cooling racks 700-702 may include immersion fluid circulation systems that are configured to circulate the immersion fluid 704, heat exchanger devices that are configured to remove heat from immersion fluid as it is circulated, and/or any other immersion cooling components known in the art. Further still, while the immersion cooling racks 700-702 are described as being filled with the immersion fluid 704 prior to connecting the immersion cooling cable tracing systems that includes data cables to the computing devices 700a and 702a, one of skill in the art in possession of the present disclosure will appreciate how the immersion cooling immersion cooling cable tracing systems that includes data cables may be connected to the computing devices 700a and 702a (i.e., the computing devices in the immersion cooling racks may be "cabled" and/or otherwise inter connected) prior to the immersion cooling racks 700-702 being filled with immersion fluid while remaining within the scope of the present disclosure as well.

The method 600 then proceeds to block 604 where immersion cooling cable tracing system(s) are connected to computing device(s). With reference to FIG. 8, in an embodiment of block 604, the immersion cooling cable tracing system 200 discussed above with reference to FIG. 2A is illustrated as connected to a pair of computing devices 800a and 800b, and one of skill in the art in possession of the present disclosure will appreciate how either of the computing devices 800a and 800b may be provided by any of the computing devices 700a and 702a discussed above with reference to FIG. 7 (e.g., the computing devices 800a and 800b may be provided by the same computing device 700a or 702a in one of the immersion cooling racks 700 or 702, different computing devices 700a or 702a in one of the immersion cooling racks 700 or 702, or different computing devices 700a and 702a in each of the immersion cooling racks 700 and 702).

Furthermore, one of skill in the art in possession of the present disclosure will appreciate how the computing devices 800a and 800b may include conventional computing device ports, and the example in FIG. 8 illustrates how the first connector 206 on the immersion cooling cable tracing system 200 is connected to the computing device port on the computing device 800a such that the first connector 206 and the air inlet/outlet 210a are immersed in the immersion fluid 704 with the air inlet/outlet 210a directed parallel to the surface 704a of the immersion fluid 704, while the second connector 208 on the immersion cooling cable tracing system 200 is connected to the computing device port on the computing device 800b such that the second connector 208 and the air inlet/outlet 210b are immersed in the immersion fluid 704 with the air inlet/outlet 210b directed parallel to the surface 704a of the immersion fluid 704.

With reference to FIG. 9, in another embodiment of block 604, the immersion cooling cable tracing system 200 discussed above with reference to FIG. 2B is illustrated as connected to a pair of computing devices 900a and 900b, and one of skill in the art in possession of the present disclosure will appreciate how either of the computing devices 900a and 900b may be provided by any of the computing devices 700a and 702a discussed above with reference to FIG. 7 (e.g., the computing devices 900a and 900b may be provided by the same computing device 700a or 702a in one of the immersion cooling racks 700 or 702, different computing devices 700a or 702a in one of the immersion cooling racks 700 or 702, or different computing devices 700a and 702a in each of the immersion cooling racks 700 and 702).

Furthermore, one of skill in the art in possession of the present disclosure will appreciate how the computing devices 900a and 900b may include conventional computing device ports, and the example in FIG. 9 illustrates how the first connector 206 on the immersion cooling cable tracing system 200 is connected to the computing device port on the computing device 900a such that the first connector 206 and the air inlet/outlet 212a are immersed in the immersion fluid 704 with the air inlet/outlet 212a directed towards the surface 704a of the immersion fluid 704, while the second connector 208 on the immersion cooling cable tracing system 200 is connected to the computing device port on the computing device 900b such that the second connector 208 and the air inlet/outlet 212b are immersed in the immersion fluid 704 with the air inlet/outlet 212b directed towards the surface 704a of the immersion fluid 704.

With reference to FIG. 10, in another embodiment of block 604, the immersion cooling cable tracing system 300 discussed above with reference to FIG. 3 is illustrated as connected to a pair of computing devices 1000a and 1000b, and one of skill in the art in possession of the present disclosure will appreciate how either of the computing devices 1000a and 1000b may be provided by any of the computing devices 700a and 702a discussed above with reference to FIG. 7 (e.g., the computing devices 1000a and 1000b may be provided by the same computing device 700a or 702a in one of the immersion cooling racks 700 or 702, different computing devices 700a or 702a in one of the immersion cooling racks 700 or 702, or different computing devices 700a and 702a in each of the immersion cooling racks 700 and 702). Furthermore, one of skill in the art in possession of the present disclosure will appreciate how the computing devices 1000a and 1000b may include conventional computing device ports, and the example in FIG. 10 illustrates how the first connector 206 on the immersion cooling cable tracing system 300 is connected to the computing device port on the computing device 1000a such that the first connector 206 and the air inlet/outlet 302a are immersed in the immersion fluid 704, while the second connector 208 on the immersion cooling cable tracing system 300 is connected to the computing device port on the computing device 1000b such that the second connector 208 and the air inlet/outlet 302b are immersed in the immersion fluid 704.

Figure 11A:
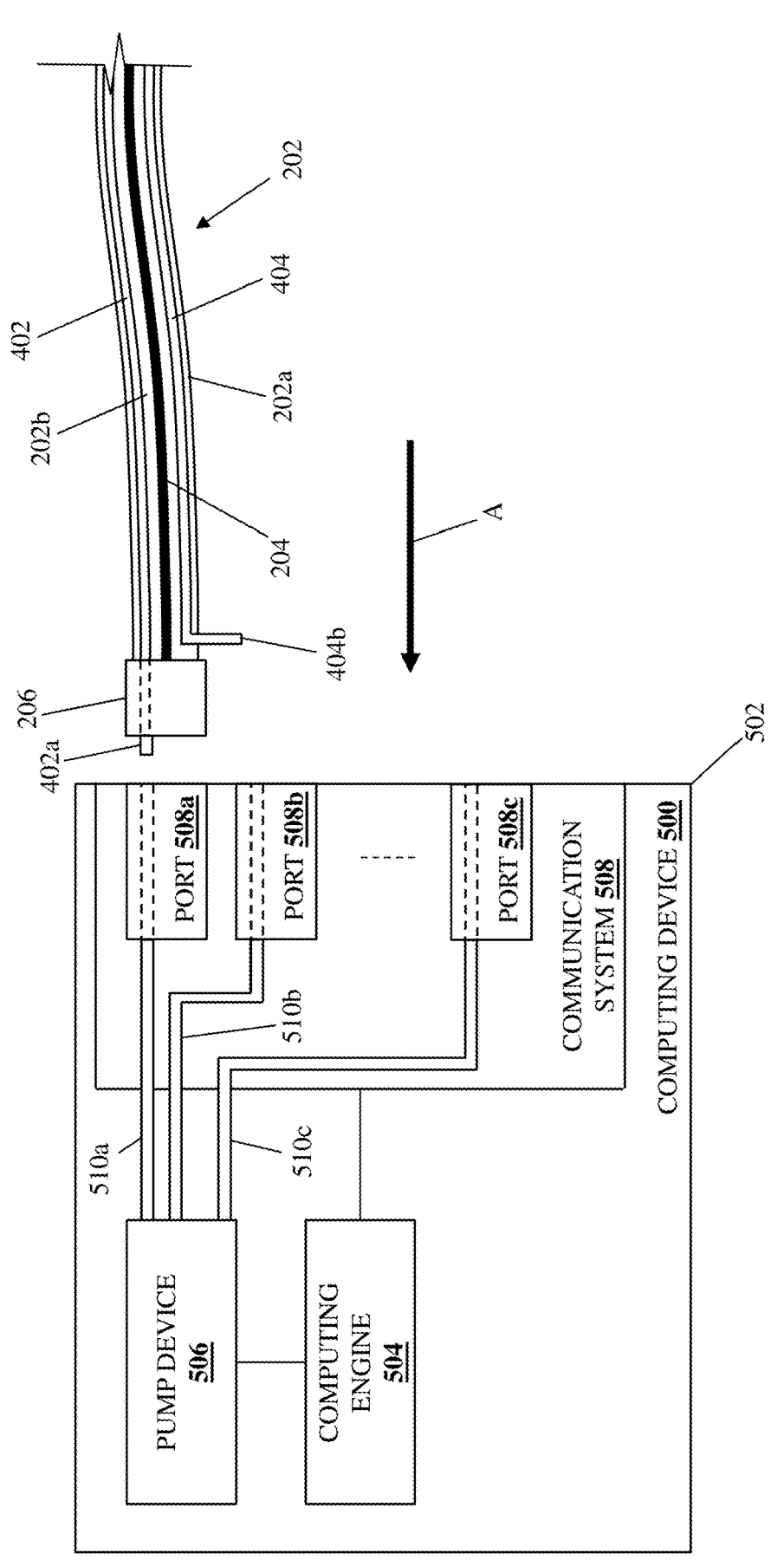
FIG. 11A is a schematic view illustrating an embodiment of the immersion cooling cable tracing system of FIG. 4 being connected to the computing device of FIG. 5 in the immersion cooling system of FIG. 7.
Figure 11B:
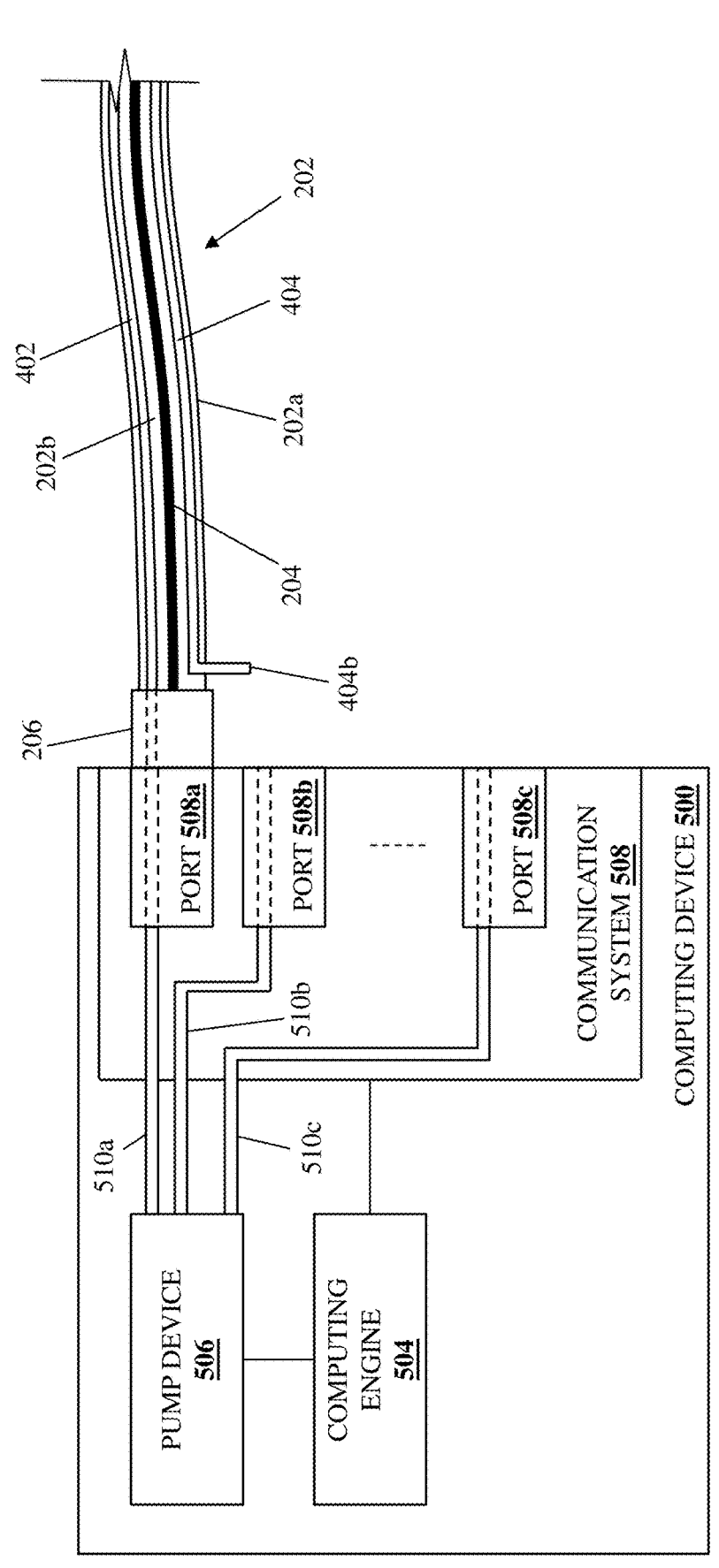
FIG. 11B is a schematic view illustrating an embodiment of the immersion cooling cable tracing system of FIG. 4 connected to the computing device of FIG. 5 in the immersion cooling system of FIG. 7.

With reference to FIGS. 11A, 11B, and 11C, in another embodiment of block 604, the immersion cooling cable tracing system 400 discussed above with reference to FIG. 4 is illustrated as connected to a pair of computing devices 1100a and 1100b that may each be provided by the computing device 500 discussed above with reference to FIG. 5, and one of skill in the art in possession of the present disclosure will appreciate how either of the computing devices 1100a and 1100b may be provided by any of the computing devices 700a and 702a discussed above with reference to FIG. 7 (e.g., the computing devices 1000a and 1000b may be provided by the same computing device 700a or 702a in one of the immersion cooling racks 700 or 702, different computing devices 700a or 702a in one of the immersion cooling racks 700 or 702, or different computing devices 700a and 702a in each of the immersion cooling racks 700 and 702).

For example, the first connector 206 on the immersion cooling cable tracing system 400 may be positioned adjacent the computing device 500/1100A such that it is aligned with the computing device port 508a, as visible in FIG. 11A, and the first connector 206 may then be moved in a direction A such that the air inlet 402a on the immersion cooling cable tracing system 400 is coupled to the air conduit 510a on the computing device port 508a when the first connector 206 engages the computing device port 508a to couple the data conduit 204 to the computing engine 504. Furthermore, while not illustrated or described in detail, one of skill in the art in possession of the present disclosure will appreciate how the second connector 208 on the immersion cooling cable tracing system 400 may be connected to the computing device 500/1100B in a similar manner. As such, the example in FIG. 11C illustrates how the first connector 206 on the immersion cooling cable tracing system 400 is connected to the computing device port on the computing device 1100a such that the first connector 206 and the air outlet 404b are immersed in the immersion fluid 704, while the second connector 208 on the immersion cooling cable tracing system 400 is connected to the computing device port on the computing device 1100b such that the second connector 208 and the air outlet 402b are immersed in the immersion fluid 704.

As will be appreciated by one of skill in the art in possession of the present disclosure, following block 604, any of the computing devices 700a and/or 702a in the immersion cooling racks 700 and/or 702 may operate to transmit data between each other using the data cables included in the immersion cooling cable tracing systems that connect them. Furthermore, during the operation of the computing devices 700 and 702a, the immersion fluid 704 may be circulated (e.g., using the immersion fluid circulation subsystems discussed above) such that it directly contacts and transfers heat generated by heat producing components in the computing devices 700a and 702a, and then moves through heat exchanger devices to dissipate that heat.

The method 600 then proceeds to decision block 606 where the method 600 proceeds depending on whether data cable tracing is required. As will be appreciated by one of skill in the art in possession of the present disclosure, data cable tracing may be required to identify a particular data cable connected to computing device(s) in the immersion cooling racks 700 and/or 702, to troubleshoot connectivity issues with computing device(s) in the immersion cooling racks 700 and/or 702, and/or in other data cable tracing situations that would be apparent to one of skill in the art in possession of the present disclosure. If, at decision block 606, data cable tracing is not required, the method 600 returns to decision block 606. As such, the method 600 may loop until cable tracing is required.

If, at decision block 606, data cable tracing is required, the method 600 proceeds to block 608 where an airflow is generated and provided at an air inlet on an immersion cooling cable tracing system that includes a data cable being traced. With reference to FIG. 12, in an embodiment of block 608, a user of the immersion cooling cable tracing system 200 of FIG. 2A may provide an airflow generation device that is illustrated as being provided by a pump device 1200 that may include a hand-held manual pump device, a hand-held powered (e.g., battery or Universal Serial Bus (USB) powered) pump device, and/or any of a variety of other airflow generation devices that would be apparent to one of skill in the art in possession of the present disclosure. As illustrated, a flexible air conduit 1202 is illustrated as extending from the pump device 1200, and one of skill in the art in possession of the present disclosure will appreciate how the user may connect a distal end 1202a of the flexible air conduit 1202 to the air inlet/outlet 210a on the immersion cooling cable tracing system 200 at block 608.

With reference to FIGS. 13A and 13B, in another embodiment of block 608, a user of the immersion cooling cable tracing system 200 of FIG. 2B may provide an airflow generation device that is illustrated as being provided by a pump device 1300 that may include a hand-held manual pump device, a hand-held powered (e.g., battery or USB powered) pump device, and/or any of a variety of other airflow generation devices that would be apparent to one of skill in the art in possession of the present disclosure. As illustrated, a rigid air conduit 1302 is illustrated as extending from the pump device 1300, and the user may position the pump device 1300 adjacent the surface 704 of the immersion fluid 704 such that a distal end 1302a of the rigid air conduit 1302 is aligned with the air inlet 212a on the immersion cooling cable tracing system 200 as illustrated in FIG. 13A, and then may move the pump device 1300 in a direction B to connect the distal end 1302a of the rigid air conduit 1302 to the air inlet 212a on the immersion cooling cable tracing system 200 at block 608, as illustrated in FIG. 13B. As will be appreciated by one of skill in the art in possession of the present disclosure, the rigid air conduit 1302 on the pump device 1300 and the air inlet 212a on the immersion cooling cable tracing system 200 may be configured to allow their connection without the need for the user to submerge their hand in the immersion fluid 704.

With reference to FIG. 14, in another embodiment of block 608, a user of the immersion cooling cable tracing system 300 of FIG. 3 may provide an airflow generation device that is illustrated as being provided by a pump device 1400 that may include a hand-held manual pump device, a hand-held powered (e.g., battery or USB powered) pump device, and/or any of a variety of other airflow generation devices that would be apparent to one of skill in the art in possession of the present disclosure. As illustrated, a flexible air conduit 1402 is illustrated as extending from the pump device 1400, and one of skill in the art in possession of the present disclosure will appreciate how the user may connect a distal end 1402a of the flexible air conduit 1402 to the air inlet 302a on the immersion cooling cable tracing system 300 at block 608.

The method 600 then proceeds to block 610 where an air conduit on the immersion cooling cable tracing system transmits the airflow along the length of the data cable such that the airflow is released through an air outlet on the immersion cooling cable tracing system and into the immersion fluid. With reference to FIG. 15, in an embodiment of block 610, the user may activate the pump device 1200 (e.g., via manual operation of the pump device 1200, actuation of a powered subsystem in the pump device 1200, etc., as indicated by element 1500 in FIG. 15), and one of skill in the art in possession of the present disclosure will appreciate how activation of the pump device 1200 may cause the pump device 1200 to generate an airflow that is directed via the flexible air conduit 1202. The airflow generated by the pump device 1200 may then flow from the flexible air conduit 1202 and into the air conduit 210 on the immersion cooling cable tracing system 200 via the air inlet/outlet 210a, with the air conduit 210 transmitting that airflow along the length of the data cable 202.

As illustrated in FIG. 15, the air inlet/outlet 210b may then release the airflow transmitted through the air conduit 210 such that air bubbles 1502 move through the immersion fluid 704 and up to the surface 704a, and one of skill in the art in possession of the present disclosure will appreciate how the user may identify those air bubbles 1502 to identify the portion of the data cable 202, the second connector 208, and/or the computing device 800b that are connected to the computing device 800a and the first connector 206. Furthermore, in some embodiments, the pump device 1200 may be configured to introduce or otherwise provide a visible gas (e.g., a colored smoke or vapor) into the airflow it generates, which one of skill in the art in possession of the present disclosure will appreciate may allow that visible gas to rise from the surface 704a of the immersion fluid 704 to further facilitate identification of the data cable 202, the second connector 208, and/or the computing device 800b.

Further still, while the pump device 1200 is illustrated and described as being connected to the air inlet/outlet 210a on the immersion cooling cable tracing system 200 to identify the portion of the data cable 202, the second connector 208, and/or the computing device 800b that are connected to the computing device 800a and the first connector 206, one of skill in the art in possession of the present disclosure will appreciate how the pump device 1200 may be connected to the air inlet/outlet 210b on the immersion cooling cable tracing system 200 to identify the portion of the data cable 202, the first connector 206, and/or the computing device 800a that are connected to the computing device 800b and the second connector 208 while remaining within the scope of the present disclosure as well.

With reference to FIG. 16, in another embodiment of block 610, the user may activate the pump device 1300 (e.g., via manual operation of the pump device 1300, actuation of a powered subsystem in the pump device 1300, etc., as indicated by element 1600 in FIG. 16), and one of skill in the art in possession of the present disclosure will appreciate how activation of the pump device 1300 may cause the pump device 1300 to generate an airflow that is directed via the flexible air conduit 1302. The airflow generated by the pump device 1300 may then flow from the flexible air conduit 1302 and into the air conduit 210 on the immersion cooling cable tracing system 200 via the air inlet/outlet 212a, with the air conduit 210 transmitting that airflow along the length of the data cable 202.

As illustrated in FIG. 16, the air inlet/outlet 212b may then release the airflow transmitted through the air conduit 210 such that air bubbles 1602 move through the immersion fluid 704 and up to the surface 704a, and one of skill in the art in possession of the present disclosure will appreciate how the user may identify those air bubbles 1602 to identify the portion of the data cable 202, the second connector 208, and/or the computing device 900b that are connected to the computing device 900a and the first connector 206. Furthermore, in some embodiments, the pump device 1300 may be configured to introduce or otherwise provide a visible gas (e.g., a colored smoke or vapor) into the airflow it generates, which one of skill in the art in possession of the present disclosure will appreciate may allow that visible gas to rise from the surface 704a of the immersion fluid 704 to further facilitate identification of the data cable 202, the second connector 208, and/or the computing device 900b.

Further still, while the pump device 1300 is illustrated and described as being connected to the air inlet/outlet 212a on the immersion cooling cable tracing system 200 to identify the portion of the data cable 202, the second connector 208, and/or the computing device 900b that are connected to the computing device 900a and the first connector 206, one of skill in the art in possession of the present disclosure will appreciate how the pump device 1300 may be connected to the air inlet/outlet 212b on the immersion cooling cable tracing system 200 to identify the portion of the data cable 202, the first connector 206, and/or the computing device 900a that are connected to the computing device 900b and the second connector 208 while remaining within the scope of the present disclosure as well.

With reference to FIG. 17, in another embodiment of block 610, the user may activate the pump device 1400 (e.g., via manual operation of the pump device 1400, actuation of a powered subsystem in the pump device 1400, etc., as indicated by element 1700 in FIG. 17), and one of skill in the art in possession of the present disclosure will appreciate how activation of the pump device 1400 may cause the pump device 1400 to generate an airflow that is directed via the flexible air conduit 1402. The airflow generated by the pump device 1400 may then flow from the flexible air conduit 1402 and into the air conduit 302 on the immersion cooling cable tracing system 300 via the air inlet/outlet 302a, with the air conduit 302 transmitting that airflow along the length of the data cable 202.

As illustrated in FIG. 17, the air inlet/outlet 302b may then release the airflow transmitted through the air conduit 302 such that air bubbles 1702 move through the immersion fluid 704 and up to the surface 704a, and one of skill in the art in possession of the present disclosure will appreciate how the user may identify those air bubbles 1702 to identify the portion of the data cable 202, the second connector 208, and/or the computing device 1000b that are connected to the computing device 1000a and the first connector 206. Furthermore, in some embodiments, the pump device 1400 may be configured to introduce or otherwise provide a visible gas (e.g., a colored smoke or vapor) into the airflow it generates, which one of skill in the art in possession of the present disclosure will appreciate may allow that visible gas to rise from the surface 704a of the immersion fluid 704 to further facilitate identification of the data cable 202, the second connector 208, and/or the computing device 1000b.

Further still, while the pump device 1400 is illustrated and described as being connected to the air inlet/outlet 302a on the immersion cooling cable tracing system 300 to identify the portion of the data cable 202, the second connector 208, and/or the computing device 1000b that are connected to the computing device 1000a and the first connector 206, one of skill in the art in possession of the present disclosure will appreciate how the pump device 1400 may be connected to the air inlet/outlet 302b on the immersion cooling cable tracing system 300 to identify the portion of the data cable 202, the first connector 206, and/or the computing device 1000a that are connected to the computing device 1000b and the second connector 208 while remaining within the scope of the present disclosure as well.

Figure 18A:
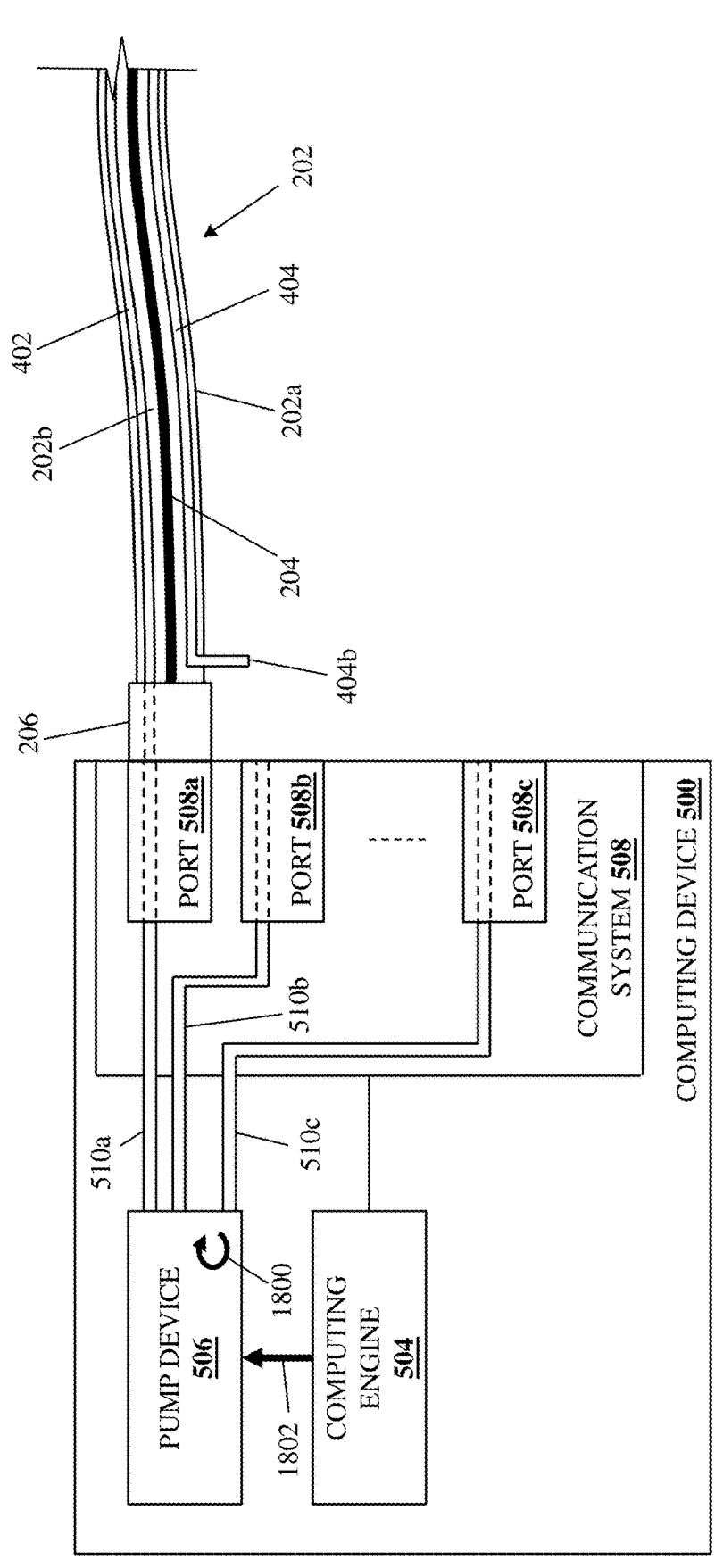
FIG. 18A is a schematic view illustrating a pump device in the computing device of FIG. 5 operating with the immersion cooling cable tracing system of FIG. 4 in order to provide for cable tracing.

With reference to FIG. 18A, in an embodiment of block 610, the user may activate the pump device 506 by transmitting an instruction to the computing engine 504 (e.g., via a network and through the port 508a (or other ports 508b-508c) on the communication system 508) to cause the computing engine 504 to perform pump activation operations 1802 that activate the pump device 506, and one of skill in the art in possession of the present disclosure will appreciate how activation of the pump device 506 may cause the pump device 506 to generate an airflow that is directed via the air conduit 510a and through the computing device port 508a into the air conduit 402 on the immersion cooling cable tracing system 400 via the air inlet 402a, with the air conduit 402 transmitting that airflow along the length of the data cable 202.

As illustrated in FIG. 18B, the air outlet 402b may then release the airflow transmitted through the air conduit 402 such that air bubbles 1804 move through the immersion fluid 704 and up to the surface 704a, and one of skill in the art in possession of the present disclosure will appreciate how the user may identify those air bubbles 1804 to identify the portion of the data cable 202, the second connector 208, and/or the computing device 1100b that are connected to the computing device 1100a and the first connector 206. Furthermore, in some embodiments, the pump device 506 may be configured to introduce or otherwise provide a visible gas (e.g., a colored smoke or vapor) into the airflow it generates, which one of skill in the art in possession of the present disclosure will appreciate may allow that visible gas to rise from the surface 704a of the immersion fluid 704 to further facilitate identification of the data cable 202, the second connector 208, and/or the computing device 1100b.

Further still, while the pump device 506 in the computing device 500/1100a is illustrated and described as providing an airflow via the air inlet 402a and out of the air outlet 402b on the immersion cooling cable tracing system 400 to identify the portion of the data cable 202, the second connector 208, and/or the computing device 1100b that are connected to the computing device 1100a and the first connector 206, one of skill in the art in possession of the present disclosure will appreciate how a pump device 506 in the computing device 500/1100b may provide an airflow via the air inlet 404a and out of the air outlet 404b on the immersion cooling cable tracing system 400 to identify the portion of the data cable 202, the first connector 206, and/or the computing device 1100a that are connected to the computing device 1100b and the second connector 208 while remaining within the scope of the present disclosure as well.

Thus, systems and methods have been described that provide an airflow conduit on data cables that may be used to transmit airflow received via an airflow inlet along the length of a data cable and to an airflow outlet that releases that airflow into an immersion fluid in which its connected computing device is immersed. For example, the immersion cooling cable tracing system of the present disclosure may include a data cable having a first connector that is included on a first end of the data cable, and a second connector that is included on a second end of the data cable that is opposite the data cable from the first end. An air conduit is included on the data cable, extends along a length of the data cable, that includes an air inlet that is configured to receive an airflow, and an air outlet that is located adjacent to the second connector. The air outlet is configured to release the airflow received through the air conduit and via the air inlet into an immersion fluid when the second connector and the air outlet are immersed in the immersion fluid. As such, data cables that are connected to computing devices immersed in immersion fluid may be easily traced by identifying the airflow being released into the immersion fluid via the immersion cooling cable tracing system that includes that data cable.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An immersion cooling cable tracing system, comprising:
   a data cable;
   a first connector that is included on a first end of the data cable;
   a second connector that is included on a second end of the data cable that is opposite the data cable from the first end; and
   an air conduit that is included on the data cable, that extends along a length of the data cable, that includes an air inlet that is configured to receive an airflow, and that includes an air outlet that is located adjacent to the second connector and that is configured to release the airflow received through the air conduit and via the air inlet into an immersion fluid when the second connector and the air outlet are immersed in the immersion fluid.

2. The system of claim 1, wherein the air inlet is located adjacent to the first connector.

3. The system of claim 1, wherein the air conduit extends along an outer surface of the data cable.

4. The system of claim 1, wherein the air conduit extends through an interior of the data cable.

5. The system of claim 1, wherein the air conduit extends through the first connector, and the air inlet extends from the first connector and is configured to engage a computing device connector to couple to a pump device that is included in a computing device that includes the computing device connector and that is configured to generate the airflow.

6. The system of claim 1, wherein the air inlet is configured to be directed towards a surface of an immersion fluid when the first connector engages a computing device port on a computing device that is immersed in the immersion fluid such that the first connector and the air inlet are immersed in the immersion fluid.

7. An Information Handling System (IHS), comprising:
   a chassis that is immersed in an immersion fluid;
   a communication system that is housed in the chassis and that includes a communication port that is accessible on the chassis;
   a processing system that is housed in the chassis and that is coupled to the communication port;
   a data cable;
   a first connector that is included on a first end of the data cable and that is connected to the communication port; and
   an air conduit that is included on the data cable, that extends along a length of the data cable, that includes an air inlet that is configured to receive an airflow, and that includes an air outlet that is located adjacent to the first connector and that is configured to release the airflow received through the air conduit and via the air inlet into the immersion fluid.

8. The IHS of claim 7, wherein the air inlet is located adjacent to a second connector that is located on a second end of the data cable that is opposite the data cable from the first end.

9. The IHS of claim 7, wherein the air conduit extends along an outer surface of the data cable.

10. The IHS of claim 7, wherein the air conduit extends through an interior of the data cable.

11. The IHS of claim 7, wherein the air conduit extends through the second connector, and the air inlet extends from the second connector and is configured to engage a computing device port to couple to a pump device that is included in a computing device that includes the computing device port and that is configured to generate the airflow.

12. The IHS of claim 7, wherein the air inlet is directed towards a surface of an immersion fluid when the second connector engages a computing device port on a computing device that is immersed in the immersion fluid such that the second connector and the air inlet are immersed in the immersion fluid.

13. The IHS of claim 12, wherein the air inlet is configured to be moved between a first orientation in which the air inlet is directed towards the surface of the immersion fluid when the second connector engages the computing device port on the computing device that is immersed in the immersion fluid, and a second orientation in which the air inlet is directed parallel to the surface of the immersion fluid when the second connector engages the computing device port on the computing device that is immersed in the immersion fluid.

14. A method for cable tracing in an immersion cooling system, comprising:
   connecting, by a first connector on a first end of a data cable, to a first computing device;
   connecting, by a second connector on a second end of the data cable that is opposite the data cable from the first end, to a second computing device that is immersed in an immersion fluid;
   receiving, by an air inlet on an air conduit that is included on the data cable, an airflow;
   transmitting, by the air conduit along a length of the data cable, the airflow; and
   releasing, by an air outlet on the air conduit that is located adjacent to the second connector, the airflow received through the air conduit and via the air inlet into the immersion fluid.

15. The method of claim 14, wherein the air inlet is located adjacent to the first connector.

16. The method of claim 14, wherein the air conduit extends along an outer surface of the data cable.

17. The method of claim 14, wherein the air conduit extends through an interior of the data cable.

18. The method of claim 14, wherein the air conduit extends through the first connector, the air inlet extends from the first connector, and the method further includes:
   engaging, by the air inlet, a computing device connector to couple to a pump device that is included in a computing device that includes the computing device connector and that is configured to generate the airflow.

19. The method of claim 14, wherein the air inlet is directed towards a surface of an immersion fluid when the first connector is connected to the first computing device that is immersed in the immersion fluid.

20. The method of claim 19, further comprising:
   moving, by the air inlet, from a first orientation in which the air inlet is directed parallel to the surface of the immersion fluid when the first connector is connected to the first computing device, to a second orientation in which the air inlet is directed towards the surface of the immersion fluid when the first connector is connected to the first computing device.

* * * * *